United States Patent
Yamazaki

(10) Patent No.: US 9,570,625 B2
(45) Date of Patent: Feb. 14, 2017

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 15/016,322

(22) Filed: Feb. 5, 2016

(65) Prior Publication Data

US 2016/0163872 A1 Jun. 9, 2016

Related U.S. Application Data

(63) Continuation of application No. 14/091,634, filed on Nov. 27, 2013, now Pat. No. 9,293,540.

(30) Foreign Application Priority Data

Dec. 3, 2012 (JP) .................................. 2012-264583

(51) Int. Cl.
*H01L 29/786* (2006.01)
*H01L 29/423* (2006.01)
(Continued)

(52) U.S. Cl.
CPC ......... *H01L 29/7869* (2013.01); *H01L 29/247* (2013.01); *H01L 29/41733* (2013.01);
(Continued)

(58) Field of Classification Search
CPC .......... H01L 29/7869; H01L 29/78606; H01L 29/78621; H01L 29/78636; H01L 29/78696
(Continued)

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

EP  1737044 A  12/2006
EP  2226847 A  9/2010
(Continued)

OTHER PUBLICATIONS

Nakayama et al., "17a-TL-8 Effect of GaO Layer on IGZO Channel", Extended Abstracts (The 57th Spring Meeting 2010), The Japan Society of Applied Physics and Related Societies, Mar. 17, 2010, pp. 21-008.
(Continued)

*Primary Examiner* — Cuong Q Nguyen
*Assistant Examiner* — Tong-Ho Kim
(74) *Attorney, Agent, or Firm* — Nixon Peabody LLP; Jeffrey L. Costellia

(57) ABSTRACT

To provide a semiconductor device which can be miniaturized or highly integrated. To obtain a semiconductor device including an oxide semiconductor, which has favorable electrical characteristics. To provide a highly reliable semiconductor device including an oxide semiconductor, by suppression of a change in its electrical characteristics. The semiconductor device includes an island-like oxide semiconductor layer over an insulating surface; an insulating layer surrounding a side surface of the oxide semiconductor layer; a source electrode layer and a drain electrode layer in contact with top surfaces of the oxide semiconductor layer and the insulating layer; a gate electrode layer overlapping with the oxide semiconductor layer; and a gate insulating layer between the oxide semiconductor layer and the gate electrode layer. The source electrode layer and the drain electrode layer are provided above the top surface of the
(Continued)

oxide semiconductor layer. The top surface of the insulating layer is planarized.

11 Claims, 21 Drawing Sheets

(51) Int. Cl.
H01L 29/417 (2006.01)
H01L 29/24 (2006.01)

(52) U.S. Cl.
CPC .. *H01L 29/42384* (2013.01); *H01L 29/78606* (2013.01); *H01L 29/78621* (2013.01); *H01L 29/78636* (2013.01); *H01L 29/78696* (2013.01)

(58) Field of Classification Search
USPC .......................... 257/43, 359; 438/104, 151
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,431,449 B2 | 4/2013 | Suzawa et al. |
| 8,987,731 B2 | 3/2015 | Yamazaki |
| 9,064,966 B2 | 6/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0030108 A1* | 2/2003 | Morosawa ............ H01L 29/458 257/359 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0133177 A1* | 6/2011 | Suzawa ............... H01L 27/1225 257/43 |
| 2011/0193083 A1 | 8/2011 | Kim et al. |
| 2011/0215317 A1 | 9/2011 | Yamazaki et al. |
| 2011/0215328 A1 | 9/2011 | Morosawa et al. |
| 2011/0237035 A1 | 9/2011 | Yan et al. |
| 2012/0119205 A1 | 5/2012 | Taniguchi et al. |
| 2012/0132904 A1* | 5/2012 | Yamazaki ......... H01L 21/02422 257/43 |
| 2012/0187395 A1 | 7/2012 | Koezuka |
| 2012/0187396 A1 | 7/2012 | Yamazaki et al. |
| 2012/0187397 A1* | 7/2012 | Yamazaki ........... H01L 27/1225 257/43 |
| 2012/0241734 A1 | 9/2012 | Honda et al. |
| 2013/0092925 A1 | 4/2013 | Saito et al. |
| 2013/0092926 A1 | 4/2013 | Yamazaki |
| 2013/0092928 A1 | 4/2013 | Yamazaki |
| 2013/0092940 A1 | 4/2013 | Tezuka et al. |
| 2013/0320334 A1 | 12/2013 | Yamazaki et al. |
| 2013/0334533 A1 | 12/2013 | Yamazaki |
| 2014/0077205 A1 | 3/2014 | Yamazaki et al. |

(56) References Cited

U.S. PATENT DOCUMENTS

| | | | |
|---|---|---|---|
| 2014/0151691 | A1 | 6/2014 | Matsubayashi et al. |
| 2014/0154837 | A1 | 6/2014 | Yamazaki |
| 2014/0175435 | A1 | 6/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2012-160679 A | 8/2012 |
| WO | WO-2004/114391 | 12/2004 |
| WO | WO-2008/133345 | 11/2008 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al.. "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YBFe2O4, and YB2Fe3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev.B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al. "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

(56) References Cited

OTHER PUBLICATIONS

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

* cited by examiner 101 103    104a 104b    161

166

166    107

166    107

SEMICONDUCTOR DEVICE

BACKGROUND OF THE INVENTION

1. Field of the Invention

The present invention relates to an object, a method, a manufacturing method, a process, a machine, a manufacture, or a composition of matter. In particular, the present invention relates to a semiconductor device, a display device, a light-emitting device, a method for driving them, or a method for fabricating them, for example.

In this specification, a "semiconductor device" generally refers to a device which can function by utilizing semiconductor characteristics; an electrooptic device, a light-emitting display device, a semiconductor circuit, and an electronic device are all included in semiconductor devices.

2. Description of the Related Art

A technique by which transistors are formed using semiconductor thin films formed over a substrate having an insulating surface has been attracting attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, a technique for forming a transistor using zinc oxide or an In—Ga—Zn-based oxide semiconductor as an oxide semiconductor is disclosed (see Patent Documents 1 and 2).

In recent years, demand for an integrated circuit in which transistors and the like are integrated with high density has risen with reductions in the size and weight of an electronic device.

REFERENCE

Patent Document

[Patent Document 1] Japanese Published Patent Application No. 2007-123861

[Patent Document 2] Japanese Published Patent Application No. 2007-096055

SUMMARY OF THE INVENTION

An object of one embodiment of the present invention is to provide a semiconductor device which can be miniaturized or highly integrated.

Another object of one embodiment of the present invention is to obtain a semiconductor device including an oxide semiconductor, which has favorable electrical characteristics.

A further object of one embodiment of the present invention is to inhibit a change in electrical characteristics of a semiconductor device including an oxide semiconductor. A still further object of one embodiment of the present invention is to provide a highly reliable semiconductor device. A yet still further object of one embodiment of the present invention is to provide a novel semiconductor device. A yet still further object of one embodiment of the present invention is to provide a semiconductor device which does not easily become normally on. A yet still further object of one embodiment of the present invention is to provide a semiconductor device in which a leakage current is not easily increased. A yet still further object of one embodiment of the present invention is to provide a semiconductor device in which a threshold voltage is not easily changed. A yet still further object of one embodiment of the present invention is to provide a semiconductor device in which a threshold voltage is not easily degraded. A yet still further object of one embodiment of the present invention is to provide a semiconductor device which is not easily affected by a short channel effect. A yet still further object of one embodiment of the present invention is to provide a semiconductor device in which a source region and a drain region are not easily short-circuited. A yet still further object of one embodiment of the present invention is to provide a semiconductor device which is not easily affected by a variation in channel length.

Note that the descriptions of these objects do not disturb the existence of other objects. Note that there is no need to achieve all of these objects with one embodiment of the present invention. Other objects will be apparent from and can be derived from the description of the specification, the drawings, the claims, and the like.

One embodiment of the present invention is a semiconductor device including an island-like oxide semiconductor layer over an insulating surface; an insulating layer surrounding a side surface of the oxide semiconductor layer; a source electrode layer and a drain electrode layer in contact with a top surface of the oxide semiconductor layer and a top surface of the insulating layer; a gate electrode layer overlapping with the oxide semiconductor layer; and a gate insulating layer between the oxide semiconductor layer and the gate electrode layer. The source electrode layer and the drain electrode layer are provided above the top surface of the oxide semiconductor layer. The top surface of the insulating layer is planarized.

It is preferable that the semiconductor device of one embodiment of the present invention further include an oxide layer between the oxide semiconductor layer and the insulating layer, and the oxide layer be in contact with the side surface of the oxide semiconductor layer.

In the semiconductor device of one embodiment of the present invention, it is preferable that the source electrode layer include a first source electrode layer and a second source electrode layer stacked over the first source electrode layer, the drain electrode layer include a first drain electrode layer and a second drain electrode layer stacked over the first drain electrode layer, the first source electrode layer and the first drain electrode layer be in contact with the top surface of the oxide semiconductor layer and the top surface of the insulating layer, and the second source electrode layer and the second drain electrode layer be in contact with the top surface of the oxide semiconductor layer.

It is preferable that the semiconductor device of one embodiment of the present invention further include a first oxide layer in contact with a bottom surface of the oxide semiconductor layer, and the insulating layer surround a side surface of the first oxide layer.

It is preferable that the semiconductor device of one embodiment of the present invention further include a second oxide layer in contact with the top surface of the oxide semiconductor layer, a top surface of the source electrode layer, and a top surface of the drain electrode layer.

In one embodiment of the present invention, a semiconductor device which can be miniaturized or highly integrated can be provided.

In one embodiment of the present invention, a semiconductor device including an oxide semiconductor can have favorable electrical characteristics.

In one embodiment of the present invention, a highly reliable semiconductor device including an oxide semiconductor can be provided by suppression of a change in its electrical characteristics.

DETAILED DESCRIPTION OF THE INVENTION

Figure 1A:
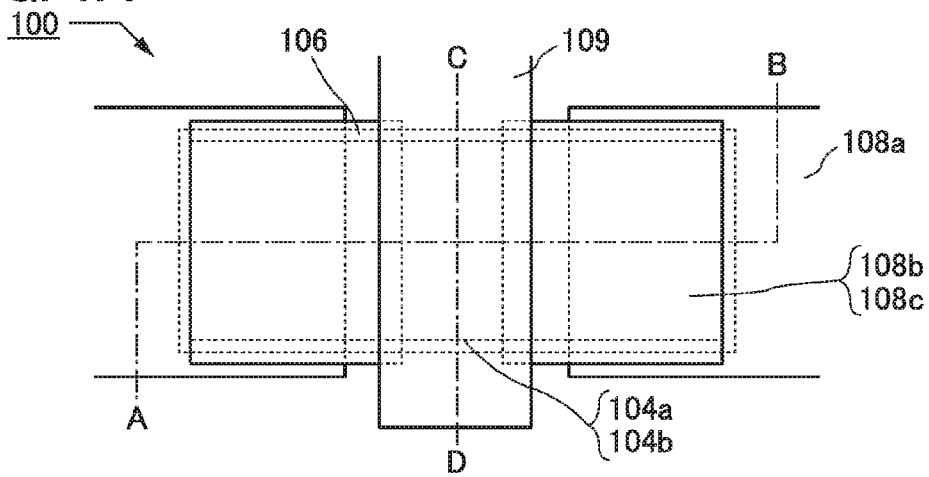
FIGS. 1A to 1C illustrate a structural example of a transistor of one embodiment.

Embodiments will be described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such scales.

Note that in this specification and the like, ordinal numbers such as "first" and "second" are used in order to avoid confusion among components and do not limit the number.

Note that functions of the source and the drain may be switched in the case where transistors of different polarities are employed or in the case where the direction of a current flow changes in a circuit operation. Therefore, the terms "source" and "drain" can be used to denote the drain and the source, respectively, in this specification.

Embodiment 1

Figure 11:
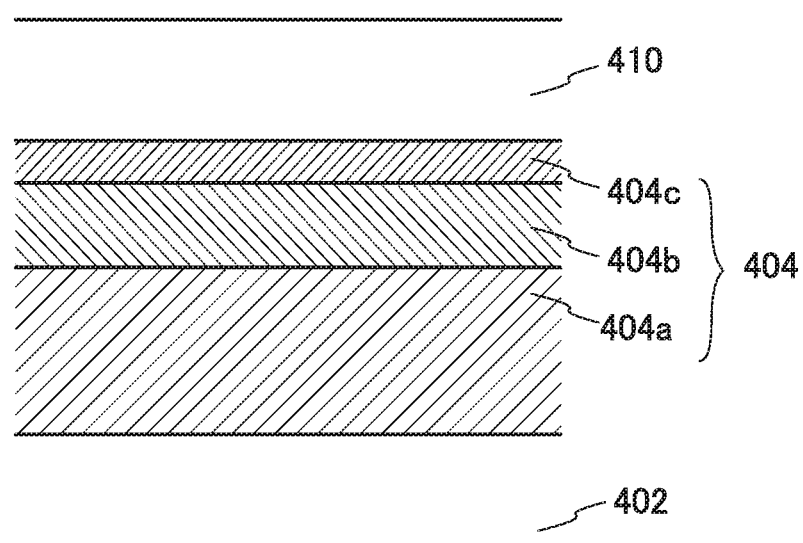
FIG. 11 is a schematic diagram illustrating a stacked-layer structure of a transistor of one embodiment.

In this embodiment, a stacked-layer structure of a semiconductor device of one embodiment of the present invention will be described with reference to FIG. 11.

The stacked-layer structure of the semiconductor device includes an oxide stack 404 between an insulating layer 402 and a gate insulating layer 410. Further, the oxide stack 404 includes a first oxide layer 404a, an oxide semiconductor layer 404b, and a second oxide layer 404c.

Each of the first oxide layer 404a and the second oxide layer 404c is an oxide layer containing one or more kinds of metal elements which form the oxide semiconductor layer 404b.

The oxide semiconductor layer 404b includes a layer represented by an In-M-Zn oxide, which contains at least indium, zinc, and M (M is a metal element such as Al, Ga, Ge, Y, Zr, Sn, La, Ce, or HO. The oxide semiconductor layer 404b preferably contains indium because the carrier mobility of a transistor is increased.

The first oxide layer 404a under the oxide semiconductor layer 404b includes an oxide layer which is represented by an In-M-Zn oxide (M is a metal element such as Al, Ti, Ga, Ge, Y, Zr, Sn, La, Ce, or Hf) and in which the atomic ratio of M to In is higher than that in the oxide semiconductor layer 404b. Specifically, the amount of any of the above elements in the first oxide layer 404a in an atomic ratio is 1.5 times or more, preferably 2 times or more, further preferably 3 times or more as much as that in the oxide semiconductor layer 404b in an atomic ratio. Any of the above elements is more strongly bonded to oxygen than indium, and thus has a function of suppressing generation of an oxygen vacancy in the oxide layer. That is, an oxygen vacancy is more unlikely to be generated in the first oxide layer 404a than in the oxide semiconductor layer 404b.

Further, in a manner similar to the first oxide layer 404a, the second oxide layer 404c over the oxide semiconductor layer 404b includes an oxide layer which is represented by an In-M-Zn oxide (M is a metal element such as Al, Ti, Ga, Ge, Y, Zr, Sn, La, Ce, or Hf) and in which the atomic ratio of M to In is higher than that in the oxide semiconductor layer 404b. Specifically, the amount of any of the above elements in the second oxide layer 404c in an atomic ratio is 1.5 times or more, preferably 2 times or more, further preferably 3 times or more as much as that in the oxide semiconductor layer 404b in an atomic ratio.

In other words, when each of the first oxide layer 404a, the oxide semiconductor layer 404b, and the second oxide layer 404c is an In-M-Zn oxide containing at least indium, zinc, and M (M is a metal element such as Al, Ti, Ga, Ge, Y, Zr, Sn, La, Ce, or Hf), and the first oxide layer 404a has an atomic ratio of In to M and Zn which is $x_1:y_1:z_1$, the oxide semiconductor layer 404b has an atomic ratio of In to M and Zn which is $x_2:y_2:z_2$, and the second oxide layer 404c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more as large as $y_2/x_2$, preferably 2 times or more, further preferably 3 times or more as large as $y_2/x_2$. At this time, when $y_2$ is greater than or equal to $x_2$ in the oxide semiconductor layer 404b, a transistor can have stable electrical characteristics. However, when $y_2$ is 3 times or more as large as $x_2$, the field-effect mobility of the transistor is reduced; accordingly, $y_2$ is preferably smaller than 3 times $x_2$.

Note that when the first oxide layer 404 a is an In-M-Zn oxide, it is preferable that, in the atomic ratio between In and M, the proportion of In be less than 50 atomic % and the proportion of M be greater than or equal to 50 atomic %, and it is further preferable that, in the atomic ratio between In and M, the proportion of In be less than 25 atomic % and the proportion of M be greater than or equal to 75 atomic %. When the oxide semiconductor layer 404b is an In-M-Zn oxide, it is preferable that, in the atomic ratio between In and M, the proportion of In be greater than or equal to 25 atomic % and the proportion of M be less than 75 atomic %, and it is further preferable that, in the atomic ratio between In and M, the proportion of In be greater than or equal to 34 atomic % and the proportion of M be less than 66 atomic %. When the second oxide layer 404c is an In-M-Zn oxide, it is preferable that, in the atomic ratio between In and M, the proportion of In be less than 50 atomic % and the proportion of M be greater than or equal to 50 atomic %, and it is further preferable that, in the atomic ratio between In and M, the proportion of In be less than 25 atomic % and the proportion of M be greater than or equal to 75 atomic %.

The constituent elements of the first oxide layer 404a and the second oxide layer 404c may be different from each other, or their constituent elements may be the same at the same atomic ratios or different atomic ratios.

For the first oxide layer 404a, the oxide semiconductor layer 404b, and the second oxide layer 404c, for example, an oxide semiconductor containing indium, zinc, and gallium can be used.

The thickness of the first oxide layer 404 a is greater than or equal to 3 nm and less than or equal to 100 nm, preferably greater than or equal to 3 nm and less than or equal to 50 nm. The thickness of the oxide semiconductor layer 404b is greater than or equal to 3 nm and less than or equal to 200 nm, preferably greater than or equal to 3 nm and less than or equal to 100 nm, further preferably greater than or equal to 3 nm and less than or equal to 50 nm.

It is preferable that each of the first oxide layer 404a and the second oxide layer 404c contain one or more kinds of metal elements forming the oxide semiconductor layer 404b and be formed using an oxide semiconductor whose energy at the bottom of the conduction band is higher than that of the oxide semiconductor layer 404b by 0.05 eV or more, 0.07 eV or more, 0.1 eV or more, or 0.15 eV or more and is close to the vacuum level by 2 eV or less, 1 eV or less, 0.5 eV or less, or 0.4 eV or less.

In such a structure, when a voltage is applied to a gate electrode layer overlapping with the oxide stack 404 with the gate insulating layer 410 provided therebetween, a channel is formed in the oxide semiconductor layer 404b of the oxide stack 404, whose energy at the bottom of the conduction band is the lowest. In other words, the second oxide layer 404c is formed between the oxide semiconductor layer 404b and the gate insulating layer 410, whereby a structure in which the channel of the transistor is not in contact with the gate insulating layer 410 can be obtained.

[Band Structure of Oxide Stack]

A band structure of the oxide stack 404 is described. A stack corresponding to the oxide stack 404 in which an In—Ga—Zn oxide having an energy gap of 3.15 eV is used as a layer corresponding to each of the first oxide layer 404a and the second oxide layer 404c and an In—Ga—Zn oxide having an energy gap of 2.8 eV is used as a layer corresponding to the oxide semiconductor layer 404b is fabricated, and the band structure thereof is analyzed. Note that for convenience, the stack is referred to as an oxide stack, and the layers forming the stack are referred to as a first oxide layer, an oxide semiconductor layer, and a second oxide layer.

The thickness of each of the first oxide layer, the oxide semiconductor layer, and the second oxide layer was 10 nm. The energy gap was measured with the use of a spectroscopic ellipsometer (UT-300 manufactured by HORIBA Jobin Yvon). Further, the energy gap in the vicinity of an interface between the first oxide layer and the oxide semiconductor layer was 3 eV, and the energy gap in the vicinity of an interface between the second oxide layer and the oxide semiconductor layer was 3 eV.

Figure 12A:
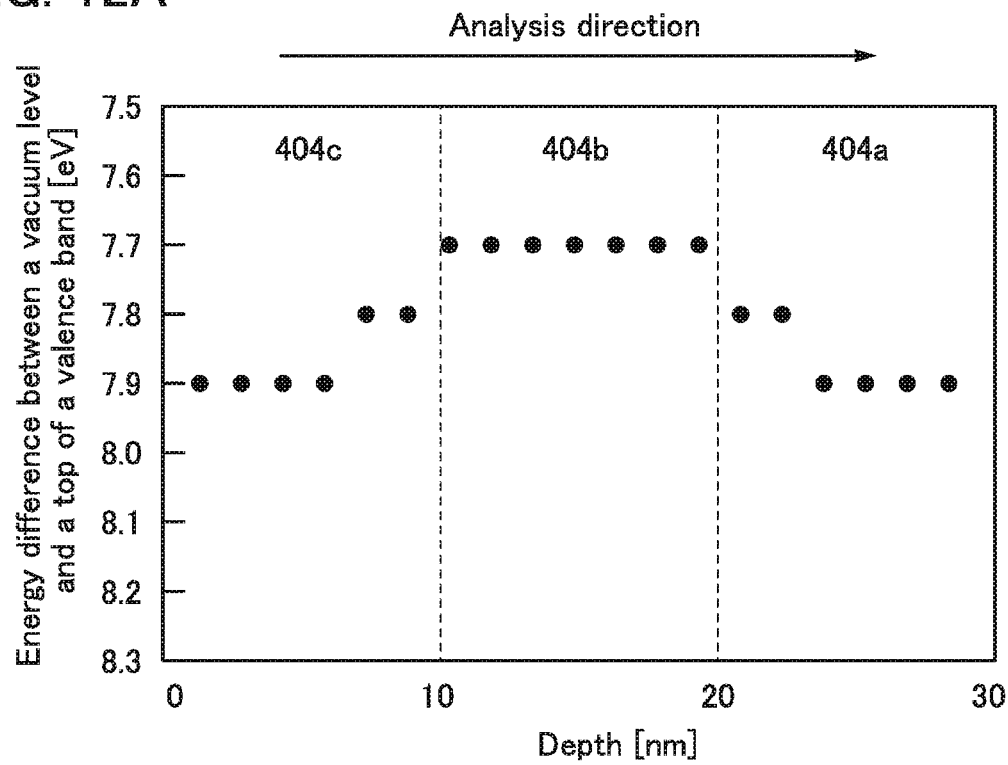
FIGS. 12A and 12B illustrate a band structure of an oxide stack of one embodiment.

In FIG. 12A, the energy difference between a vacuum level and a top of a valence band of each layer was measured while the oxide stack was etched from the second oxide layer side, and was plotted. The energy difference between the vacuum level and the top of the valence band was measured using an ultraviolet photoelectron spectroscopy (UPS) device (VersaProbe manufactured by ULVAC-PHI, Inc.).

Figure 12B:
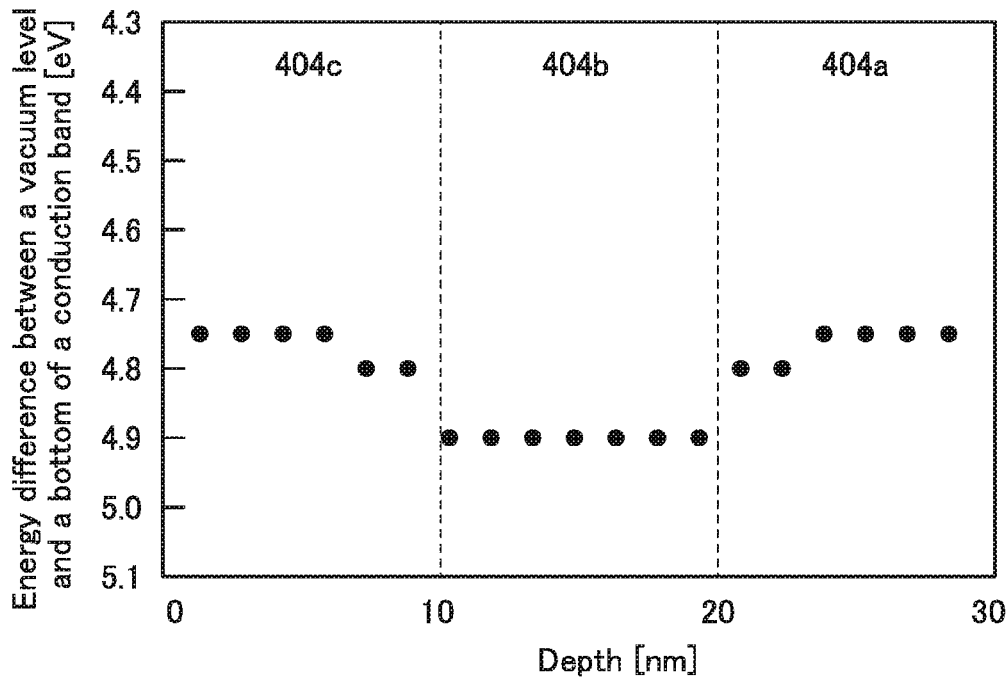

In FIG. 12B, an energy difference (electron affinity) between the vacuum level and a bottom of a conduction band of each layer, which was calculated by subtracting the energy gap of each layer from the energy difference between the vacuum level and the top of the valence band, was plotted.

Figure 13A:
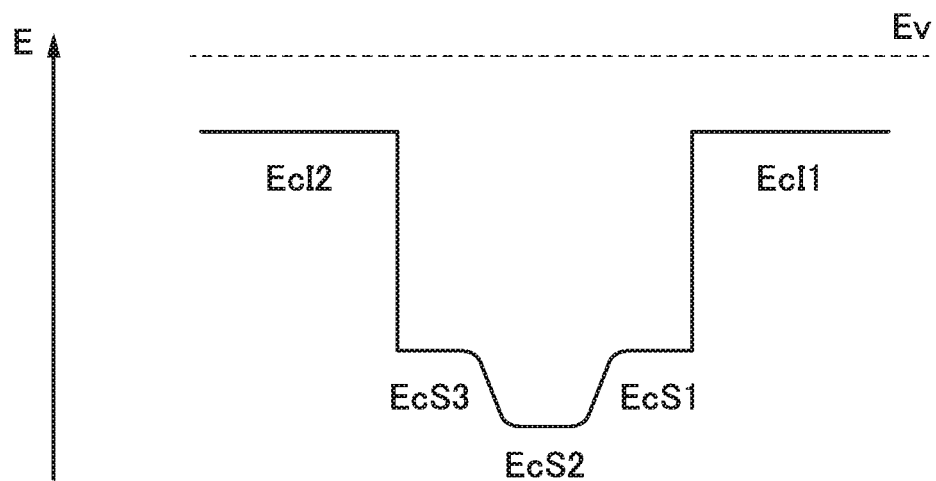
FIGS. 13A and 13B illustrate a band structure of an oxide stack of one embodiment.

Part of the band structure in FIG. 12B is schematically shown in FIG. 13A. FIG. 13A shows the case where silicon oxide films are provided in contact with the first oxide layer and the second oxide layer. Here, Ev represents energy of the vacuum level, EcI1 and EcI2 represent energy at the bottom of the conduction band of the silicon oxide film, EcS1 represents energy at the bottom of the conduction band of the first oxide layer, EcS2 represents energy at the bottom of the conduction band of the oxide semiconductor layer, and EcS3 represents energy at the bottom of the conduction band of the second oxide layer.

As shown in FIG. 13A, the energies at the bottoms of the conduction bands of the first oxide layer, the oxide semiconductor layer, and the second oxide layer are changed continuously. This can be understood also from the fact that the compositions of the first oxide layer, the oxide semiconductor layer, and the second oxide layer are close to each other and oxygen is easily diffused.

Figure 13B:
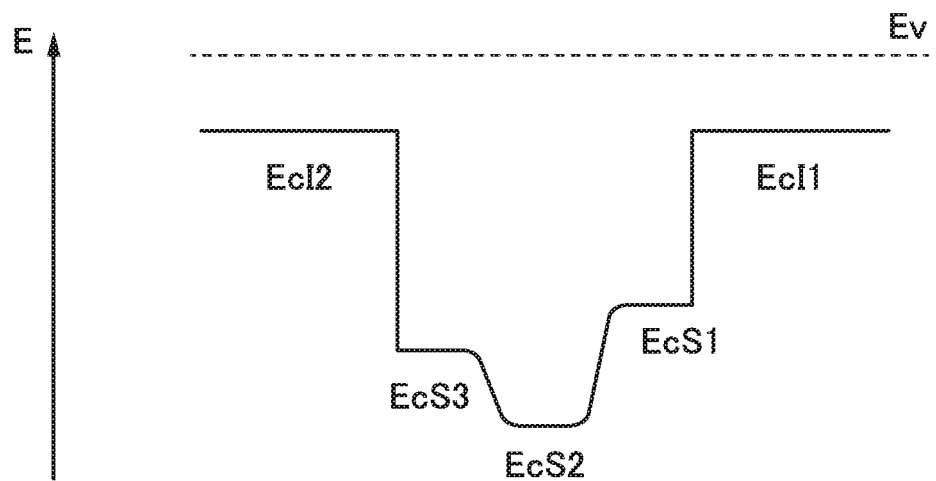

Note that although the case where the first oxide layer and the second oxide layer are oxide layers having the same energy gap is shown in FIG. 13A, the first oxide layer and the second oxide layer may be oxide layers having different energy gaps. For example, part of the band structure in the case where EcS1 is higher than EcS3 is shown in FIG. 13B. Alternatively, although not shown in FIGS. 13A and 13B, EcS3 may be higher than EcS1.

According to FIGS. 12A and 12B and FIGS. 13A and 13B, the oxide semiconductor layer of the oxide stack serves as a well and a channel of the transistor including the oxide stack is formed in the oxide semiconductor layer. Note that since the energies at the bottoms of the conduction bands are changed continuously, the structure of the oxide stack can also be referred to as a U-shaped well. Further, a channel formed to have such a structure can also be referred to as a buried channel.

Since each of the first oxide layer 404a and the second oxide layer 404c is an oxide layer containing one or more kinds of metal elements forming the oxide semiconductor layer 404b, the oxide stack 404 can also be referred to as an oxide stack in which layers containing the same main components are stacked. The oxide stack in which layers containing the same main components are stacked is formed not simply by stacking layers but so as to have a continuous energy band (here, in particular, a well structure having a U shape in which energies at the bottoms of the conduction bands are changed continuously between any of the layers). This is because when impurities which form a defect state such as a trap center or a recombination center are mixed at each interface, the continuity of the energy band is lost, and thus carriers are trapped or disappear by recombination at the interface.

In order to form a continuous energy band, the layers need to be stacked successively without exposure to the air with the use of a multi-chamber deposition apparatus (e.g., a sputtering apparatus) including a load lock chamber. Each chamber in the sputtering apparatus is preferably subjected to high vacuum evacuation (to a vacuum of about $1 \times 10^{-4}$ Pa to $5 \times 10^{-7}$ Pa) with the use of a suction vacuum evacuation pump such as a cryopump in order to remove water or the like which is an impurity for an oxide semiconductor as much as possible. Alternatively, a turbo-molecular pump is preferably used in combination with a cold trap so that a gas does not flow backward from an evacuation system to a chamber.

In order to obtain a highly purified intrinsic oxide semiconductor, a chamber needs to be subjected to high vacuum evacuation, and in addition, a sputtering gas needs to be highly purified. When a highly purified gas having a dew point of $-40°$ C. or lower, preferably $-80°$ C. or lower, further preferably $-100°$ C. or lower is used as an oxygen gas or an argon gas used as a sputtering gas, moisture or the like can be prevented from entering an oxide semiconductor as much as possible.

The first oxide layer 404a and the second oxide layer 404c which are provided over and under the oxide semiconductor layer 404b each serve as a barrier layer and can prevent a trap level formed at an interface between the oxide stack 404 and each of the insulating layers which are in contact with the oxide stack 404 (the insulating layer 402 and the gate insulating layer 410) from adversely affecting the oxide semiconductor layer 404b which serves as a main carrier path for the transistor.

For example, oxygen vacancies contained in the oxide semiconductor layer appear as localized states in deep energy area in the energy gap of the oxide semiconductor. A carrier is trapped in such localized states, so that reliability of the transistor is lowered. For this reason, oxygen vacancies contained in the oxide semiconductor layer need to be reduced. The oxide layers in which oxygen vacancies are less likely to be generated than in the oxide semiconductor layer 404b are provided over and under and in contact with the oxide semiconductor layer 404b in the oxide stack 404, whereby oxygen vacancies in the oxide semiconductor layer 404b can be reduced. For example, in the oxide semiconductor layer 404b, the absorption coefficient due to the localized states, which is obtained by measurement by a constant photocurrent method (CPM), is set lower than $1 \times 10^{-3}$/cm, preferably lower than $1 \times 10^{-4}$/cm.

Further, in the case where the oxide semiconductor layer 404b is in contact with an insulating layer including a different constituent element (e.g., a base insulating layer including a silicon oxide film), an impurity element (e.g., silicon) might be mixed into the oxide semiconductor layer 404b where a channel is formed. When an interface state is formed at an interface between the oxide semiconductor layer 404b and the insulating layer by the mixed impurity element, a decrease in electrical characteristics of the transistor, such as a change in a threshold voltage of the transistor, is caused. However, since the first oxide layer 404a contains one or more kinds of metal elements forming the oxide semiconductor layer 404b in the oxide stack 404, an interface state is not easily formed at an interface between the first oxide layer 404a and the oxide semiconductor layer 404b. Thus, providing the first oxide layer 404a makes it possible to reduce fluctuation in the electrical characteristics of the transistor, such as a threshold voltage.

In the case where a channel is formed in the vicinity of an interface between the gate insulating layer 410 and the oxide semiconductor layer 404b, interface scattering occurs at the interface and the field-effect mobility of the transistor is decreased. However, since the second oxide layer 404c contains one or more kinds of metal elements forming the oxide semiconductor layer 404b in the oxide stack 404, scattering of carriers does not easily occur at an interface between the second oxide layer 404c and the oxide semiconductor layer 404b, and thus the field-effect mobility of the transistor can be increased.

Further, the first oxide layer 404a and the second oxide layer 404c each also serve as a barrier layer which suppresses formation of an impurity level due to the entry of the constituent elements of the insulating layers which are in contact with the oxide stack 404 (the insulating layer 402 and the gate insulating layer 410) into the oxide semiconductor layer 404b.

For example, in the case of using a silicon-containing insulating layer as each of the insulating layer 402 and the gate insulating layer 410 which are in contact with the oxide stack 404, the silicon in the insulating layers or carbon which might be contained in the insulating layers enters the first oxide layer 404a or the second oxide layer 404c at a depth of several nanometers from the interface in some cases. An impurity such as silicon or carbon entering the oxide semiconductor layer forms impurity levels. The impurity levels serve as a donor and generate an electron, so that the oxide semiconductor layer may become n-type.

However, when the thickness of the first oxide layer 404a and the second oxide layer 404c is larger than several nanometers, the impurity such as silicon or carbon does not reach the oxide semiconductor layer 404b, so that the influence of impurity levels is suppressed.

Here, the concentration of silicon in the oxide semiconductor layer is lower than or equal to $3 \times 10^{18}$ atoms/cm$^3$, preferably lower than or equal to $3 \times 10^{17}$ atoms/cm$^3$. In addition, the concentration of carbon in the oxide semiconductor layer is lower than or equal to $3 \times 10^{18}$ atoms/cm$^3$, preferably lower than or equal to $3 \times 10^{17}$ atoms/cm$^3$. It is particularly preferable to sandwich or surround the oxide semiconductor layer 404b serving as a carrier path by the first oxide layer 404a and the second oxide layer 404c in order to prevent entry of much silicon or carbon, which is a Group 14 element, to the oxide semiconductor layer 404b. That is, the concentration of silicon and carbon contained in the oxide semiconductor layer 404b is preferably lower than that in the first oxide layer 404a and the second oxide layer 404c.

Note that the impurity concentration of the oxide semiconductor layer can be measured by secondary ion mass spectrometry (SIMS).

If hydrogen or moisture is contained in the oxide semiconductor layer, it can work as a donor and the oxide semiconductor layer may become n-type; therefore, in terms of achieving a well-shaped structure, it is useful to provide a protective insulating layer (e.g., a silicon nitride layer) for preventing entry of hydrogen or moisture from the outside, above the oxide stack 404.

Figure 14:
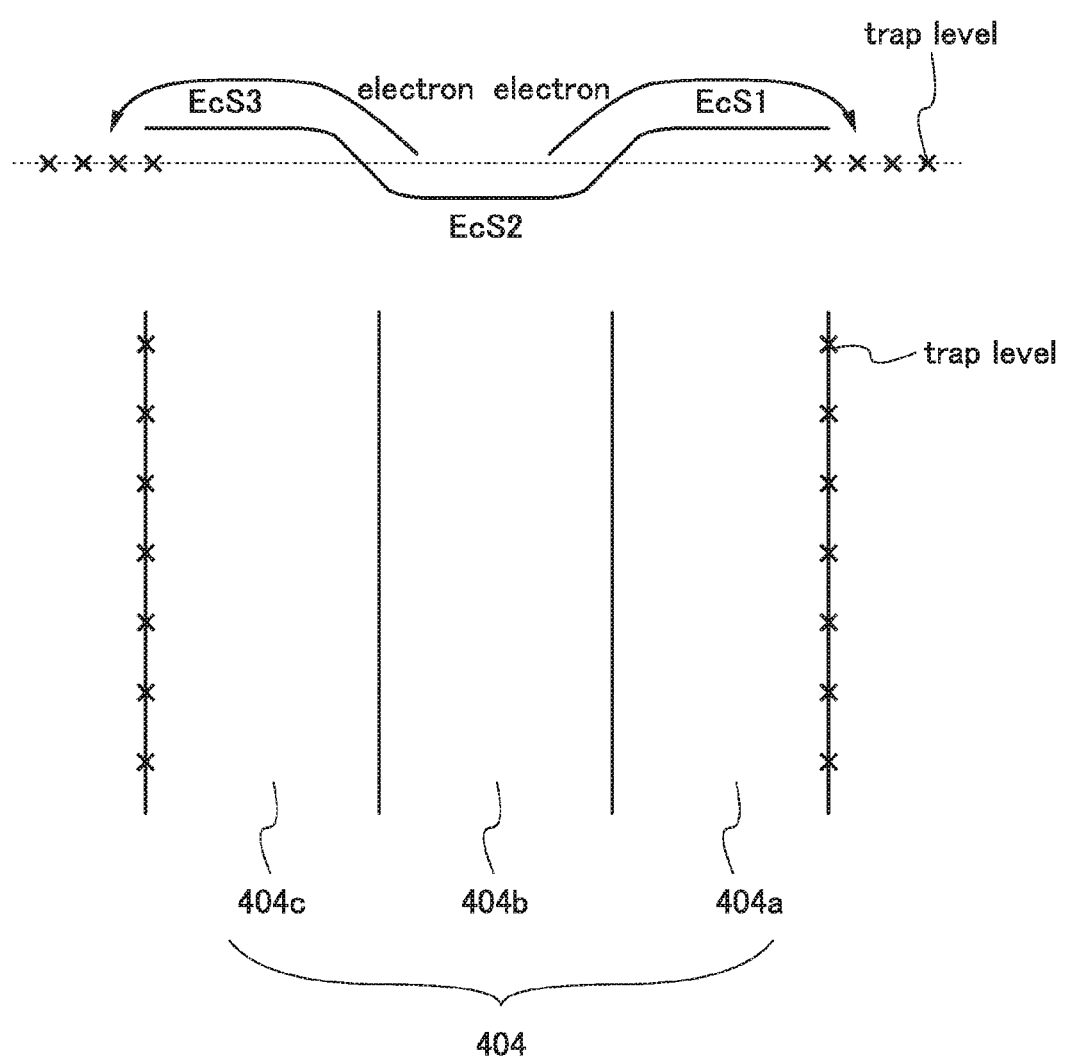
FIG. 14 illustrates a band structure of an oxide stack of one embodiment.

Note that although trap levels due to impurities or defects might be formed in the vicinity of the interface between an insulating film such as a silicon oxide film and each of the first oxide layer 404a and the second oxide layer 404c as shown in FIG. 14, the oxide semiconductor layer 404b can be distanced away from the trap levels owing to the existence of the first oxide layer 404a and the second oxide layer 404c. However, when the energy difference between EcS1 and EcS2 and the energy difference between EcS2 and EcS3 are small, an electron in the oxide semiconductor layer 404b might reach the trap level by passing over the energy difference. Since the electron is trapped in the trap level, a negative fixed charge is caused at the interface with the insulating film; thus, the threshold voltage of the transistor is shifted in the positive direction.

Thus, the energy difference between EcS1 and EcS2 and the energy difference between EcS3 and EcS2 are each preferably greater than or equal to 0.1 eV, further preferably greater than or equal to 0.15 eV because the amount of change of the threshold voltage of the transistor is reduced and the transistor has stable electrical characteristics.

[Formation of Oxide Stack]

Each of the oxide layers included in the multi-layer structure is formed using a sputtering target which contains at least indium (In) and with which a film can be formed by a sputtering method, preferably a DC sputtering method. When the sputtering target contains indium, the conductivity thereof is increased; therefore, film formation by a DC sputtering method is facilitated.

As a material forming the first oxide layer 404a and the second oxide layer 404c, a material which is represented by an In-M-Zn oxide (M is a metal element such as Al, Ti, Ga, Ge, Y, Zr, Sn, La, Ce, or Hf) is used. As M, Ga is preferably used. However, a material with a high proportion of Ga, specifically the material represented as $InGa_xZn_yO_z$ with X exceeding 10, is not suitable because powder may be generated in the deposition and deposition by a sputtering method may become difficult.

Note that for each of the first oxide layer 404a and the second oxide layer 404c, a material in which the proportion of indium in the atomic ratio is smaller than a material used for the oxide semiconductor layer 404b is used. The indium and gallium contents in the oxide layers 404a and 404c and the oxide semiconductor layer 404b can be compared with each other by time-of-flight secondary ion mass spectrometry (also referred to as TOF-SIMS) or X-ray photoelectron spectrometry (also referred to as XPS).

Each of the oxide layers included in the multi-layer structure may be in a non-single-crystal state, for example. The non-single-crystal state is, for example, structured by at least one of c-axis aligned crystal (CAAC), polycrystal, microcrystal, and an amorphous part. Among c-axis aligned crystal (CAAC), polycrystal, microcrystal, and an amorphous part, the amorphous part has the highest density of defect states, whereas CAAC has the lowest density of defect states.

Each of the oxide layers included in the multi-layer structure may include microcrystal, for example. A microcrystalline oxide film, for example, includes a microcrystal of greater than or equal to 1 nm and less than 10 nm.

Each of the oxide layers included in the multi-layer structure may include an amorphous part, for example. An amorphous oxide film, for example, has disordered atomic arrangement and no crystalline component. Alternatively, an amorphous oxide film is, for example, absolutely amorphous and has no crystal part.

Note that the oxide layers included in the multi-layer structure may each be a mixed film including any of a CAAC oxide, a microcrystalline oxide, and an amorphous oxide. The mixed film, for example, includes a region of an amorphous oxide, a region of a microcrystalline oxide, and a region of a CAAC oxide. Further, the mixed film may have a layered structure including a region of an amorphous oxide, a region of a microcrystalline oxide, and a region of a CAAC oxide, for example.

Each of the oxide layers included in the multi-layer structure may be in a single-crystal state, for example.

It is preferable that each of the oxide layers included in the multi-layer structure include a plurality of crystal parts, and in each of the crystal parts, a c-axis be aligned in a direction parallel to a normal vector of a surface where the oxide film is formed or a normal vector of a surface of the oxide film. Note that among crystal parts, the directions of the a-axis and the b-axis of one crystal part may be different from those of another crystal part. An example of such an oxide semiconductor film is a c-axis aligned crystalline oxide semiconductor (CAAC-OS) film.

When the first oxide layer 404a contains a constituent element (e.g., silicon) of the insulating layer 402 as an impurity, it might have an amorphous structure. Note that the oxide semiconductor layer 404b in which a channel is formed preferably has a crystal part. In the case where the oxide semiconductor layer 404b having a crystal part is stacked over the first oxide layer 404a having an amorphous structure, the oxide stack can be referred to as a hetero structure having different crystal structures.

In addition, the second oxide layer 404c may have an amorphous structure or include a crystal part. Formation of the second oxide layer 404c over the oxide semiconductor layer 404b having a crystal part allows the second oxide layer 404c to have a crystal structure. In this case, a boundary between the oxide semiconductor layer 404b and the second oxide layer 404c cannot be clearly identified by observation of the cross section with a transmission electron microscope (TEM) in some cases. Note that the second oxide layer 404c has lower crystallinity than the oxide semiconductor layer 404b. Hence, it can be said that the boundary can be determined by the degree of crystallinity.

At least the oxide semiconductor layer 404b in the oxide stack 404 is preferably a CAAC-OS film. In this specification and the like, a CAAC-OS film refers to an oxide semiconductor film which includes a crystal part whose c-axis is aligned in a direction substantially perpendicular to the surface of the oxide semiconductor film.

A structure of an oxide semiconductor film is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is roughly classified into a non-single-crystal oxide semiconductor film and a single-crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary does not easily occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having a low impurity concentration. The impurity is any of elements which are not the main components of the oxide semiconductor film and includes hydrogen, carbon, silicon, a transition metal element, and the like. In particular, an element (e.g., silicon) which has higher bonding strength with oxygen than a metal element included in the oxide semiconductor film causes disorder of atomic arrangement in the oxide semiconductor film because the element deprives the oxide semiconductor film of oxygen, thereby reducing crystallinity. Further, a heavy metal such as iron or nickel, argon, carbon dioxide, and the like have a large atomic radius (or molecular radius); therefore, when any of such elements is contained in the oxide semiconductor film, the element causes disorder of the atomic arrangement of the oxide semiconductor film, thereby reducing crystallinity. Note that the impurity contained in the oxide semiconductor film might become a carrier trap or a source of carriers.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (few oxygen vacancies) is referred to as "highly purified intrinsic" or "substantially highly purified intrinsic". A highly purified intrinsic or substantially highly purified intrinsic oxide semiconductor film has few carrier generation sources, and thus has a low carrier density. Thus, a transistor using the oxide semiconductor film rarely has a negative threshold voltage (rarely has normally-on characteristics). A highly purified intrinsic or substantially highly purified intrinsic oxide semiconductor film has few carrier traps. Accordingly, the transistor using the oxide semiconductor film has little variation in electrical characteristics and high reliability. Note that charges trapped by the carrier traps in the oxide semiconductor film take a long time to be released and may behave like fixed charges. Thus, the transistor using the oxide semiconductor film with a high impurity concentration and a high density of defect states has unstable electrical characteristics in some cases.

In a transistor using the CAAC-OS film, change in electrical characteristics due to irradiation with visible light or ultraviolet light is small.

Next, a microcrystalline oxide semiconductor film is described.

In an image obtained with a TEM, for example, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm, for example. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a boundary between crystal parts is not clearly detected in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. However, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction pattern) of the nc-OS film obtained by using an electron beam having a probe diameter (e.g., larger than or equal to 50 nm) larger than a diameter of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to a diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more layers of an amorphous oxide semiconductor film, a microcrystalline oxide semiconductor film, and a CAAC-OS film, for example.

The above is the description of the structure of the oxide semiconductor film.

Note that the first oxide layer $404a$ and the second oxide layer $404c$ which are included in the oxide stack $404$ might have the same structure as the above oxide semiconductor layer.

Note that it is preferable that, in the oxide stack $404$, the first oxide layer $404a$ have an amorphous structure and that a CAAC-OS film be deposited from a surface of the amorphous structure to be used as the oxide semiconductor layer $404b$.

[Formation Method of the CAAC-OS Film]

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state; whereby the CAAC-OS film can be formed.

The flat-plate-like sputtered particle has, for example, an equivalent circle diameter of a plane parallel to the a-b plane of greater than or equal to 3 nm and less than or equal to 10 nm, and a thickness (length in the direction perpendicular to the a-b plane) of greater than or equal to 0.7 nm and less than 1 nm. Note that in the flat-plate-like sputtered particle, the plane parallel to the a-b plane may be a regular triangle or a regular hexagon. Here, the term "equivalent circle diameter of a plane" refers to the diameter of a perfect circle having the same area as the plane.

For the formation of the CAAC-OS film, the following conditions are preferably used.

By increasing the substrate temperature during the deposition, migration of a sputtered particle easily occurs after the sputtered particle reaches a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when the flat-plate-like sputtered particle reaches the substrate, migration occurs on the substrate, so that a flat plane of the sputtered particle is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

After the CAAC-OS film is deposited, heat treatment may be performed. The temperature of the heat treatment is higher than or equal to 100° C. and lower than or equal to 740° C., preferably higher than or equal to 200° C. and lower than or equal to 500° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the CAAC-OS film in a short time. At the same time, the heat treatment in an inert atmosphere might generate oxygen vacancies in the CAAC-OS film. In this case, the heat treatment in an oxidation atmosphere can reduce the oxygen vacancies. The heat treatment can further increase the crystallinity of the CAAC-OS film. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the CAAC-OS film in a shorter time.

As an example of the sputtering target, an In—Ga—Zn oxide target is described below.

The polycrystalline In—Ga—Zn oxide target is made by mixing $InO_x$ powder, $GaO_y$ powder, and $ZnO_z$ powder at a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_x$ powder to $GaO_y$ powder and $ZnO_z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Alternatively, the CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature is higher than or equal to 100° C. and lower than or equal to 500° C., preferably higher than or equal to 150° C. and lower than or equal to 450° C., and the proportion of oxygen in the deposition gas is higher than or equal to 30 vol %, preferably 100 vol %.

Next, heat treatment is performed so that the first oxide semiconductor film serves as a first CAAC-OS film with high crystallinity. The temperature of the heat treatment is higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the first oxide semiconductor film in a short time. At the same time, the heat treatment in an inert atmosphere might generate oxygen vacancies in the first oxide semiconductor film. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film in a shorter time.

The first oxide semiconductor film with a thickness of greater than or equal to 1 nm and less than 10 nm can be easily crystallized by heat treatment compared to the case where the first oxide semiconductor film has a thickness of greater than or equal to 10 nm.

Next, a second oxide semiconductor film that has the same composition as the first oxide semiconductor film is formed to a thickness of greater than or equal to 10 nm and less than or equal to 50 nm. The second oxide semiconductor film is formed by a sputtering method. Specifically, the substrate temperature is higher than or equal to 100° C. and lower than or equal to 500° C., preferably higher than or equal to 150° C. and lower than or equal to 450° C., and the proportion of oxygen in the deposition gas is higher than or equal to 30 vol %, preferably 100 vol %.

Next, heat treatment is performed so that solid phase growth of the second oxide semiconductor film from the first CAAC-OS film occurs, whereby the second oxide semiconductor film is turned into a second CAAC-OS film having high crystallinity. The temperature of the heat treatment is higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the second oxide semiconductor film in a short time. At the same time, the heat treatment in an inert atmosphere might generate oxygen vacancies in the second oxide semiconductor film. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under a reduced pressure can reduce the concentration of impurities in the second oxide semiconductor film in a shorter time.

As described above, the CAAC-OS film with a total thickness of 10 nm or more can be formed. The CAAC-OS film can be favorably used as the oxide semiconductor layer in the oxide stack.

This embodiment can be combined with any of the other embodiments disclosed in this specification as appropriate.

Embodiment 2

In this embodiment, an example of a semiconductor device including the stacked structure described in Embodiment 1 and an example of a method for fabricating the semiconductor device will be described with reference to drawings. In this embodiment, a top gate transistor including an oxide semiconductor layer will be described as an example of the semiconductor device.

[Structural Example of Semiconductor Device]

Figure 1B:
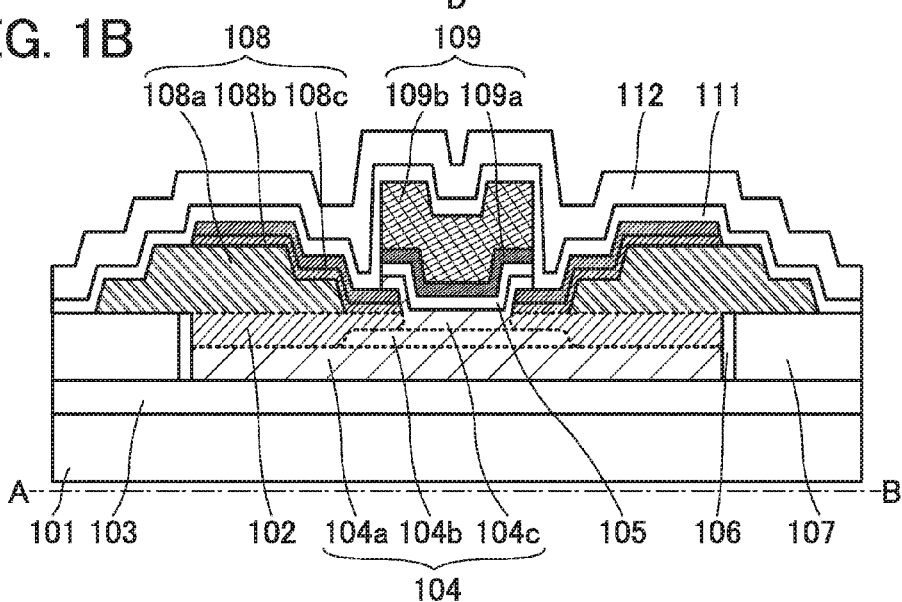
Figure 1C:
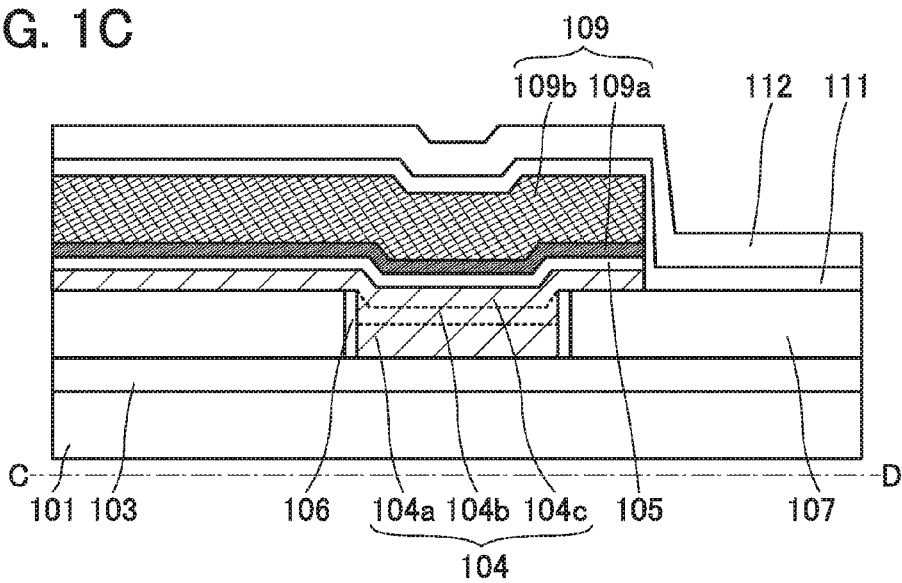

FIGS. 1A to 1C illustrate a structural example of a transistor 100. FIG. 1A is a schematic top view of the transistor 100, FIG. 1B is a schematic cross-sectional view taken along line A-B in FIG. 1A, and FIG. 1C is a schematic cross-sectional view taken along line C-D in FIG. 1A.

The transistor 100 illustrated in FIGS. 1A to 1C includes an insulating layer 103 provided over a substrate 101; a first oxide layer 104a provided over the insulating layer so as to have an island-like shape; an island-like oxide semiconductor layer 104b provided over the first oxide layer 104a; an oxide layer 106 provided in contact with side surfaces of the first oxide layer 104a and the oxide semiconductor layer 104b; an insulating layer 107 provided so as to surround the side surfaces of the first oxide layer 104a and the oxide semiconductor layer 104b and to be in contact with a side surface of the oxide layer 106; a pair of electrode layers 108a provided in contact with part of a top surface of the insulating layer 107, part of a top surface of the oxide layer 106, and part of a top surface of the oxide semiconductor layer 104b; a pair of electrode layers 108b provided over the electrode layers 108a and in contact with part of the top surface of the oxide semiconductor layer 104b; a pair of electrode layers 108c provided over and in contact with the electrode layers 108b; a second oxide layer 104c provided in contact with part of top surfaces of the pair of electrode layers 108c and part of the top surface of the oxide semiconductor layer 104b; a gate insulating layer 105 provided over the second oxide layer 104c; and an electrode layer 109a and an electrode layer 109b stacked over the gate insulating layer 105. An insulating layer 111 is provided so as to cover the above-described structure. Further, an insulating layer 112 may be provided over the insulating layer 111.

A stack including the first oxide layer 104a, the oxide semiconductor layer 104b, and the second oxide layer 104c is an oxide stack 104. Note that boundaries of these layers, which are sometimes unclear, are indicated by dashed lines in FIGS. 1B and 1C.

In the oxide stack 104, low-resistance regions 102 are formed in regions which overlap with the electrode layers 108a and the electrode layers 108b. FIG. 1B shows the low-resistance regions 102 which are formed in the oxide semiconductor layer 104b. Note that boundaries of the low-resistance regions 102 in the oxide stack 104, which are sometimes unclear, are indicated by dashed lines in FIG. 1B.

A stack including the electrode layer 108a, the electrode layer 108b, and the electrode layer 108c is an electrode layer 108. The electrode layer 108 functions as a source electrode or a drain electrode of the transistor 100. Further, a stack including the electrode layer 109a and the electrode layer 109b is an electrode layer 109. The electrode layer 109 functions as a gate electrode of the transistor 100.

The components are described below.

[Substrate]

The substrate 101 is not limited to a simple supporting substrate, and may be a substrate where a device such as a transistor is formed. In this case, at least one of the gate electrode, the source electrode, and the drain electrode which are included in the transistor 100 may be electrically connected to the above device.

[Insulating Layer]

The insulating layer 103 has a function of supplying oxygen to the oxide stack 104 as well as a function of preventing diffusion of an impurity from the substrate 101; thus, an insulating layer containing oxygen is used as the insulating layer 103. Note that in the case where the substrate 101 is a substrate where another device is formed as described above, the insulating layer 103 also has a function as an interlayer insulating layer. In that case, the insulating layer 103 is preferably subjected to planarization treatment such as chemical mechanical polishing (CMP) treatment so as to have a flat surface.

In the transistor 100 in this embodiment, the insulating layer 103 containing oxygen is provided below the stack structure (the oxide stack 104) including the oxide semiconductor layer. With such a structure, oxygen in the insulating layer 103 can be supplied to a channel formation region. The insulating layer 103 preferably has a region containing oxygen in excess of the stoichiometric composition. When the insulating layer 103 contains oxygen in excess of the stoichiometric composition, supply of oxygen to the channel formation region can be promoted.

Note that in this specification and the like, excess oxygen means oxygen which can be transferred in an oxide semiconductor layer, an oxide layer, silicon oxide, or silicon oxynitride, oxygen which exists in excess of the intrinsic stoichiometric composition, or oxygen having a function of filling Vo (oxygen vacancies) generated due to lack of oxygen.

[Gate Insulating Layer]

Oxygen might also be supplied to the oxide stack 104 from the gate insulating layer 105 provided over and in contact with the oxide stack 104.

The gate insulating layer 105 can be formed using an insulating layer containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Further, the gate insulating layer 105 may be a stacked layer of any of the above materials.

Since oxygen is supplied from both a bottom side and an upper side of the oxide stack 104, oxygen vacancies which might be included in the oxide stack 104 can be reduced.

[Protective Insulating Layer]

As the insulating layer 112 provided over the electrode layer 108 and the electrode layer 109 in the transistor 100, an insulating layer having a lower oxygen-transmitting property (or higher oxygen barrier property) than the gate insulating layer 105 is used. For example, an insulating layer having a lower oxygen-transmitting property than the gate insulating layer 105 or the insulating layer 107 is used. Since part of the insulating layer 112 covers the gate insulating layer 105 and the oxide stack 104, the insulating layer 112 formed using such a material having a low oxygen-transmitting property can inhibit desorption of oxygen from the oxide stack 104. Accordingly, generation of oxygen vacancies in the channel formation region can be inhibited. For the insulating layer 112, silicon nitride, silicon nitride oxide, aluminum oxide, or the like can be used, for example.

Further, the insulating layer 111 containing oxygen is preferably provided under the insulating layer 112. With such a structure, oxygen in the insulating layer 111 can be supplied to the channel formation region. For the insulating layer 111, a material similar to that of the insulating layer 103 can be used, for example.

The insulating layer 112 having a low oxygen-transmitting property covers the insulating layer 111 containing oxygen, whereby oxygen which is released from the insulating layer 111 or the like is prevented from leaking to the outside. Thus, it is possible to supply oxygen to the channel formation region more effectively.

Further, in an oxide semiconductor, hydrogen behaves as a supply source of carriers in addition to oxygen vacancies. When the oxide semiconductor contains hydrogen, a donor is generated at a level close to the conduction band (a shallow level), and thus the oxide semiconductor has lower resistance (n-type conductivity). Accordingly, the concentration of hydrogen in the insulating layer 111 is preferably reduced. Specifically, the concentration of hydrogen in the insulating layer 111 is preferably lower than $5 \times 10^{19}$ atoms/cm$^3$, further preferably lower than $5 \times 10^{18}$ atoms/cm$^3$.

[Oxide Stack]

The oxide stack 104 includes at least the oxide semiconductor layer 104b in which a channel is formed, the first oxide layer 104a which is provided between the oxide semiconductor layer 104b and the insulating layer 103, and the second oxide layer 104c which is provided between the oxide semiconductor layer 104b and the gate insulating layer 105.

Each of the first oxide layer 104a and the second oxide layer 104c is an oxide layer containing one or more kinds of metal elements forming the oxide semiconductor layer 104b. For the details of the oxide stack 104, refer to Embodiment 1. Here, the first oxide layer 104a, the oxide semiconductor layer 104b, and the second oxide layer 104c which are included in the transistor 100 correspond to the first oxide layer 404 a, the oxide semiconductor layer 404b, and the second oxide layer 404c in Embodiment 1, respectively.

In the oxide stack 104, the oxide layers in which oxygen vacancies are less likely to be generated than in the oxide semiconductor layer 104b are provided over and under and in contact with the oxide semiconductor layer 104b where a channel is formed, whereby generation of oxygen vacancies in the channel formation region of the transistor can be inhibited.

Note that in order to make the oxide semiconductor layer intrinsic or substantially intrinsic, the concentration of silicon in the oxide semiconductor layer, which is measured by SIMS, is set to be lower than $1 \times 10^{19}$ atoms/cm$^3$, preferably lower than $5 \times 10^{18}$ atoms/cm$^3$, further preferably lower than $3 \times 10^{18}$ atoms/cm$^3$, still further preferably lower than $1 \times 10^{18}$ atoms/cm$^3$. The concentration of hydrogen in the oxide semiconductor layer is set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. The concentration of nitrogen in the oxide semiconductor layer is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

In the case where the oxide semiconductor layer includes crystals, high concentration of silicon or carbon might reduce the crystallinity of the oxide semiconductor layer. The crystallinity of the oxide semiconductor layer can be prevented from decreasing when the concentration of silicon is lower than $1 \times 10^{19}$ atoms/cm$^3$, preferably lower than $5 \times 10^{18}$ atoms/cm$^3$, further preferably lower than $1 \times 10^{18}$ atoms/cm$^3$, and the concentration of carbon is lower than $1 \times 10^{19}$ atoms/cm$^3$, preferably lower than $5 \times 10^{18}$ atoms/cm$^3$, further preferably lower than $1 \times 10^{18}$ atoms/cm$^3$.

A transistor in which a highly purified oxide semiconductor layer is used for a channel formation region as described above has an extremely low off-state current. For example, the drain current at the time when the transistor including a highly purified oxide semiconductor layer is in an off-state at room temperature (approximately 25° C.) can be less than or equal to $1 \times 10^{-18}$ A, preferably less than or equal to $1 \times 10^{-21}$ A, and further preferably $1 \times 10^{-24}$ A; or at 85° C., less than or equal to $1 \times 10^{-15}$ A, preferably less than or equal to $1 \times 10^{-18}$ A, further preferably less than or equal to $1 \times 10^{-21}$ A. An off state of a transistor refers to a state where a gate voltage is much lower than a threshold voltage in an n-channel transistor. Specifically, the transistor is in an off state when the gate voltage is lower than the threshold voltage by 1 V or more, 2 V or more, or 3 V or more.

[Sidewall Oxide Layer]

The oxide layer 106 is provided in contact with at least the side surface of the oxide semiconductor layer 104b. It is preferable that the oxide layer 106 be provided in contact with the side surface of the first oxide layer 104a and the side surface of the oxide semiconductor layer 104b.

The oxide layer 106 is formed using an oxide which contains one or more kinds of metal elements forming the oxide semiconductor layer 104b. For example, the material which can be used for the first oxide layer 104a or the second oxide layer 104c described above can be employed. When a material containing In and M (M is a metal such as Al, Ti, Ga, Ge, Y, Zr, Sn, La, Ce, or Hf) is used for the oxide layer 106, an oxide which contains M more than In at an atomic ratio is preferably used. Alternatively, an M oxide (e.g., gallium oxide) can be used.

The width of the oxide layer 106 is greater than or equal to 0.1 nm and less than 10 nm, preferably greater than or equal to 0.5 nm and less than 5 nm, further preferably greater than or equal to 1 nm and less than 3 nm.

The oxide layer 106 in which oxygen vacancies are not easily generated is provided in contact with the side surfaces of the oxide semiconductor layer 104b and the first oxide layer 104a, whereby desorption of oxygen from the side surfaces of the oxide semiconductor layer 104b and the first oxide layer 104a is inhibited; thus, generation of oxygen vacancies can be inhibited. As a result, a transistor which has improved electrical characteristics and high reliability can be provided.

In this manner, the oxide semiconductor layer 104b in which the channel is formed is surrounded by the first oxide layer 104a, the second oxide layer 104c, and the oxide layer 106 in each of which oxygen vacancies are not easily generated, whereby oxygen vacancies which might exist in the channel can be reduced.

The insulating layer 107 is provided so as to surround the side surface of the oxide layer 106. In other words, the insulating layer 107 is provided so as to surround the oxide semiconductor layer 104b. Here, it is preferable that the top surface of the insulating layer 107 be planarized by a planarization treatment. At this time, the level of the highest region of the top surface of the oxide semiconductor layer 104b is preferably lower than the level of the top surface of the insulating layer 107. It is further preferable that the level of the highest region of the top surface of the insulating layer 107 be equal to the level of the highest region of the top surface of the oxide semiconductor layer 104b. The level of the top surface of the oxide layer 106 may be equal to the level of the top surface of the insulating layer 107 or the level of the highest region of the top surface of the oxide semiconductor layer 104b. Alternatively, the level of the top surface of the oxide layer 106 may be higher than the level of the highest region of the top surface of the oxide semiconductor layer 104b and lower than or equal to the level of the top surface of the insulating layer 107.

Here, the levels of top surfaces of two layers are determined by distances from a planar surface which is located below the two layers. For example, it is possible to use a distance from a top surface of the substrate 101 or a distance from a top surface of the insulating layer 103 which is planarized.

As described above, the side surface of the oxide semiconductor layer 104b is surrounded by the insulating layer 107 and the top surface of the oxide semiconductor layer 104b is level with or located below the insulating layer 107. In other words, the oxide semiconductor layer 104b is embedded in the insulating layer 107. Such a structure can also be called a shallow trench structure.

Here, it is preferable that a side surface of an end portion of a stack including the first oxide layer 104a and the oxide semiconductor layer 104b be substantially perpendicular to a surface where the stack is formed (e.g., the surface of the insulating layer 103), as illustrated in FIGS. 1B and 1C. When the side surface is processed in that way, the area occupied by the stack including the first oxide layer 104a and the oxide semiconductor layer 104b can be reduced, so that higher integration can be achieved.

Figure 2A:
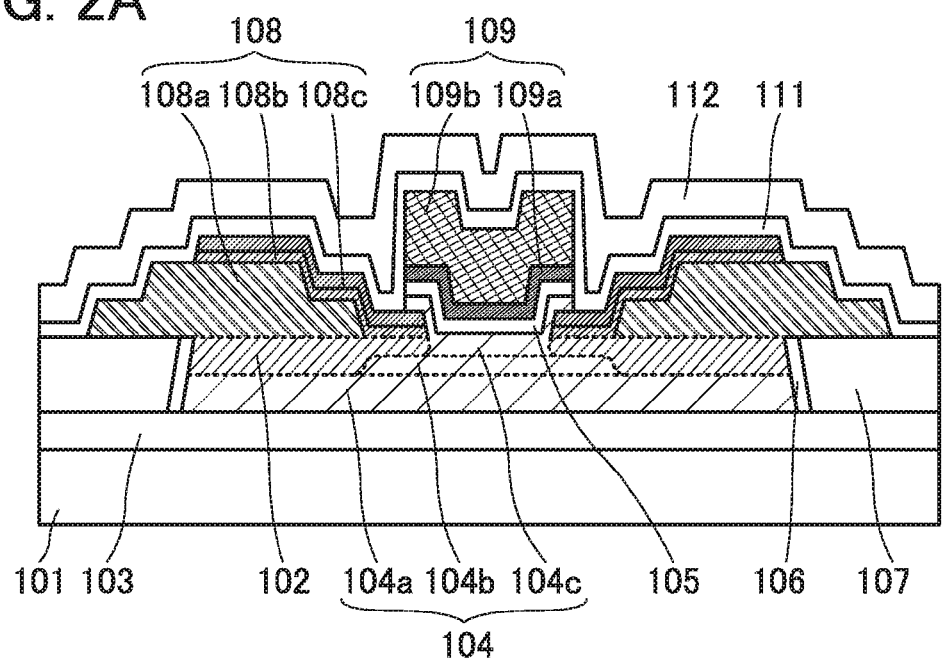
FIGS. 2A and 2B illustrate structural examples of a transistor of one embodiment.

Note that the end portion of the stack including the first oxide layer 104a and the oxide semiconductor layer 104b is tapered in some cases as illustrated in FIG. 2A, depending on processing conditions for the first oxide layer 104a and the oxide semiconductor layer 104b. When the end portion of the stack including the first oxide layer 104a and the oxide semiconductor layer 104b is processed to be tapered, coverage with a layer (e.g., the insulating layer 107) which is provided over the stack can be improved.

The above-described shallow trench structure in one embodiment of the present invention has various advantages as described below.

Owing to the oxide semiconductor layer 104b (and the first oxide layer 104a) embedded in the insulating layer 107, the above structure does not include a step at an end portion which exists in the case of forming the oxide semiconductor layer 104b (and the first oxide layer 104a) as a thin film(s) over a planar surface. Thus, at the time when the electrode layer 108 and the electrode layer 109 are formed, it is not necessary to take into account coverage at a portion which extends beyond the step, so that the degree of freedom of the process can be increased. In addition, since a thin region is not formed at the end portion of the oxide semiconductor layer 104b (and the first oxide layer 104a), the thickness of the oxide semiconductor layer 104b in a region in which the electrode layer 109 overlaps with the end portion can be uniform; therefore, the transistor can have favorable electrical characteristics.

Further, at the time when a plurality of the stacks of the oxide semiconductor layer 104b and the first oxide layer 104a are provided adjacent to each other, distances between the stacks can be small as compared to the case of formation which uses a thin film over a planar surface. Thus, it can be said that the transistor of one embodiment of the present invention can be highly integrated.

[Source Electrode and Drain Electrode]

In the transistor 100, the electrode layer 108, which functions as the source electrode or the drain electrode, includes the electrode layer 108a, the electrode layer 108b, and the electrode layer 108c. The electrode layer 108a is provided in contact with the top surfaces of the insulating layer 107, the oxide layer 106, and the oxide semiconductor layer 104b. A stack including the electrode layer 108b and the electrode layer 108c is provided so as to extend beyond an end portion of the electrode layer 108a on the channel side and to be in contact with the top surface of the oxide semiconductor layer 104b.

For the electrode layer 108a and the electrode layer 108b, a conductive material which is easily bonded to oxygen can be used. For example, Al, Cr, Cu, Ta, Ti, Mo, or W can be used. W or Ti with a relatively high melting point is preferably used, which allows subsequent process temperatures to be relatively high. Note that the conductive material which is easily bonded to oxygen includes, in its category, a material to which oxygen is easily diffused.

When such a conductive material which is easily bonded to oxygen is in contact with the oxide stack 104, oxygen in the oxide stack 104 is taken into the conductive material. There are some heating steps in a fabrication process of the transistor, and thus the above transfer of oxygen causes generation of oxygen vacancies in a region of the oxide stack 104 which is in the vicinity of an interface between the oxide stack 104 and the electrode layer 108a or 108b, so that an n-type region (the low-resistance region 102) is formed. Accordingly, the low-resistance region 102 can serve as a source or a drain of the transistor 100.

The low-resistance region 102 is formed in a region of the oxide stack 104 which is in contact with the electrode layer 108a or 108b as described above, whereby contact resistance between the electrode layer 108a or 108b and the oxide semiconductor layer 104b is reduced and parasitic resistance between a source and a drain of the transistor 100 can be reduced; accordingly, the transistor 100 can have favorable electrical characteristics.

Note that a constituent element of the electrode layer 108a or 108b might enter the low-resistance region 102. Further, part of the electrode layer 108a or 108b, which is in contact with the low-resistance region 102, might have a region having high oxygen concentration. A constituent element of the oxide stack 104 might enter the part of the electrode layer 108a or 108b, which is in contact with the low-resistance region 102. That is, in the vicinity of the interface between the oxide stack 104 and the electrode layer 108a or 108b, a portion which can also be called a mixed region or a mixed layer of the oxide stack 104 and the electrode layer 108a or 108b is formed in some cases. Note that in FIG. 1B, an interface between the low-resistance region 102 and the electrode layer 108a or 108b is schematically indicated by a dotted line.

A conductive material which is not easily bonded to oxygen is used for the electrode layer 108c. As the conductive material, for example, a metal nitride such as tantalum nitride or titanium nitride is preferably used. The electrode layer 108c which is not easily bonded to oxygen is provided in contact with a top surface of the electrode layer 108b, whereby oxygen diffused from the oxide stack 104 can be prevented from diffusing to above the electrode layer 108b through the electrode layer 108b in a region of the electrode layer 108b which is in contact with the oxide semiconductor layer 104b, and thus it is possible to prevent too much oxygen from being extracted from the oxide stack 104. Note that the conductive material which is not easily bonded to oxygen includes, in its category, a material to which oxygen is not easily diffused.

At this time, by control of the thickness of the electrode layer 108b, the depth of the low-resistance region 102 formed in a region of the oxide stack 104 which is in contact with the electrode layer 108b can be controlled. For example, when the electrode layer 108b is formed to be thinner than the electrode layer 108a, the low-resistance region 102 can have a smaller depth in a region overlapping with the electrode layer 108b than in a region overlapping with the electrode layer 108a as illustrated in FIG. 1B.

The low-resistance region 102 with a smaller depth in the vicinity of the channel formation region can function as a lightly doped drain (LDD) region and can inhibit degradation of the characteristics of the transistor 100.

Note that in the low-resistance region 102, the conductivity may vary continuously in the depth direction. For example, the shallower region often has lower resistance. In addition, the region overlapping with the electrode layer 108a and the region overlapping with the electrode layer 108b may have different conductivities. In that case, in the low-resistance region 102, a shallow region formed in the vicinity of the channel formation region preferably has lower conductivity than a deeper region, in which case degradation of the characteristics of the transistor 100 can be more inhibited.

To control the depth of the low-resistance region 102, any of the methods below can also be employed.

In one method, the materials used for the electrode layer 108a and the electrode layer 108b are different in the degree of ease of being bonded to oxygen. For example, when W is used for the electrode layer 108a and Ti is used for the electrode layer 108b, the depth of the low-resistance region 102 can differ between the region which is in contact with the electrode layer 108a and the region which is in contact with the electrode layer 108b.

Figure 2B:
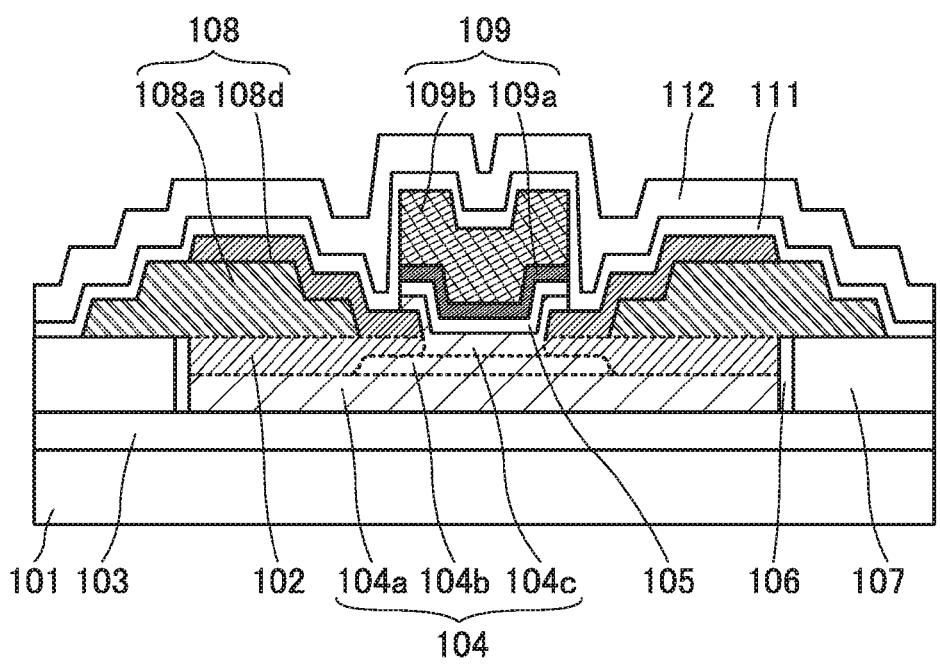

In another method, as illustrated in FIG. 2B, an electrode layer 108d in which the degree of ease of being bonded to oxygen is controlled is used instead of the stack including the electrode layer 108b and the electrode layer 108c. For the electrode layer 108d, a metal nitride in which the amount of added nitrogen is adjusted to be relatively small (a metal nitride film whose nitrogen concentration is reduced) can be used. In the case of using titanium nitride, for example, it is possible to use a material in which the proportion of titanium and the proportion of nitrogen in the composition satisfy the following relation: $0<N<Ti$.

Figure 21:
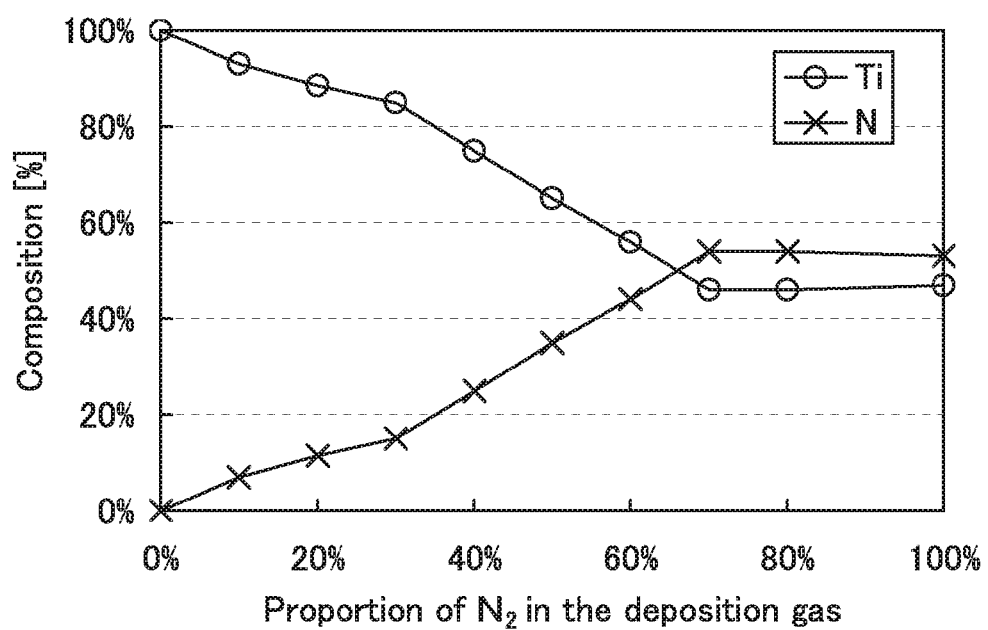
FIG. 21 shows relationship between a composition and a deposition condition of a titanium nitride film of one embodiment.

FIG. 21 shows compositions of titanium nitride films which were formed with deposition gases having various flow rate ratios. The films were each formed over a glass substrate by a sputtering method. The deposition conditions were as follows: the pressure was 0.2 Pa, a DC power of 12 kW was used, a distance between a substrate and a target was 400 mm, and a substrate temperature at the time of deposition was room temperature. A mixed gas of nitrogen and argon was used as the deposition gas, and the films were deposited with the proportion of nitrogen changed from 0% to 100%. The proportions of nitrogen and titanium in the composition of the deposited films were measured by Rutherford backscattering spectrometry (RBS). As shown in FIG. 21, as the proportion of nitrogen in the deposition gas is increased, the nitrogen content in the film can be increased. In the titanium nitride film, the nitrogen content tends to be saturated when the proportion of nitrogen in the deposition gas is about 70%, and the proportion of nitrogen in the composition of the titanium nitride film formed using the deposition gas in which the proportion of nitrogen is about 70% was about 54%.

In a region overlapping with the electrode layer 108d in which the degree of ease of being bonded to oxygen is controlled, the depth of the low-resistance region 102 formed in the oxide stack 104 can be controlled.

Figure 3A:
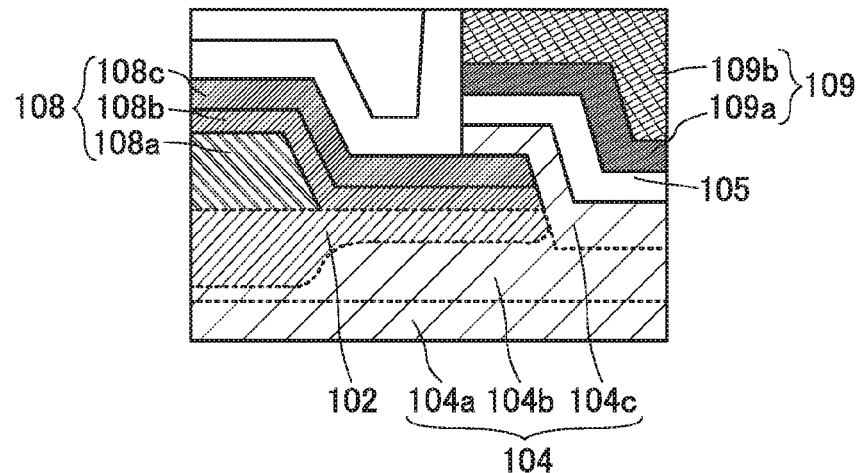
FIGS. 3A to 3C illustrate structural examples of a transistor of one embodiment.
Figure 3B:
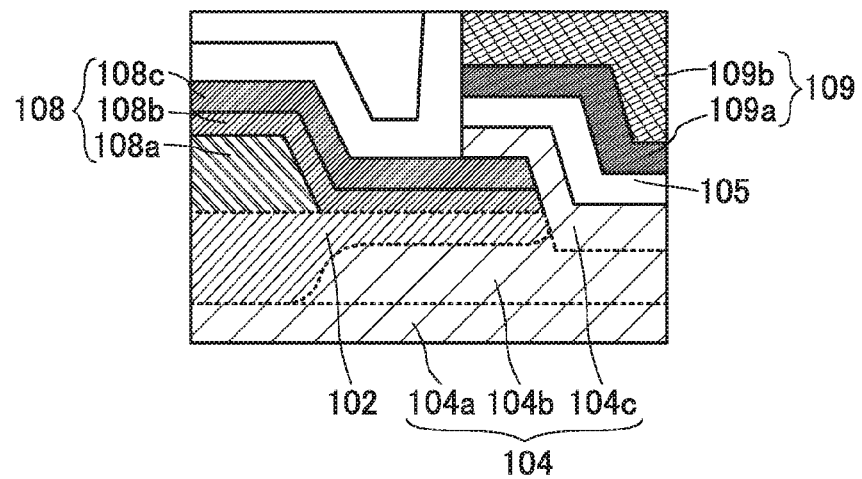
Figure 3C:
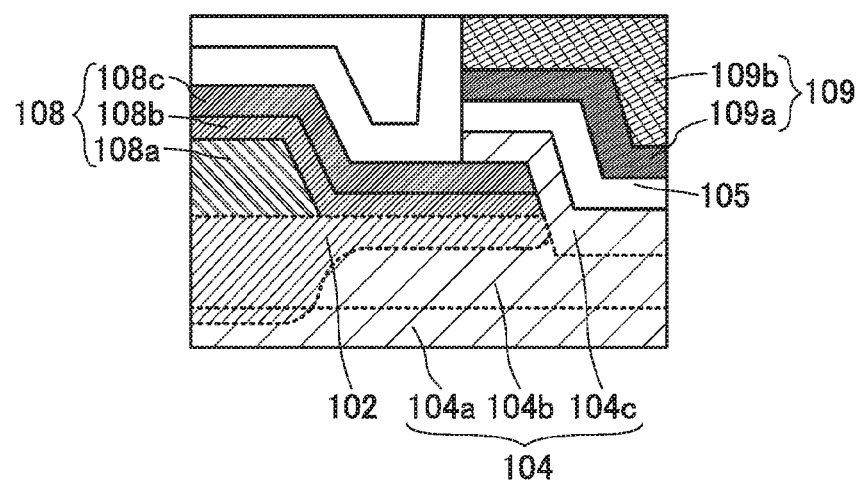

FIGS. 3A to 3C are enlarged schematic diagrams of the vicinity of the low-resistance region 102 in FIG. 1B. Here, the low-resistance region 102 in the oxide stack 104 may be formed in only the oxide semiconductor layer 104b as illustrated in FIG. 3A. Alternatively, as illustrated in FIG. 3B, the low-resistance region 102 may be formed to reach the vicinity of an interface between the oxide semiconductor layer 104b and the first oxide layer 104a in the depth direction. Further alternatively, as illustrated in FIG. 3C, the low-resistance region 102 reaches the first oxide layer 104a in some cases.

Note that in the transistor having the structure illustrated in FIGS. 1A to 1C, the channel length refers to a distance between the pair of electrode layers 108b.

Further, in the transistor having the structure illustrated in FIGS. 1A to 1C, a channel is formed in a part of the oxide semiconductor layer 104b which is between the pair of electrode layers 108b.

Furthermore, in the transistor having the structure illustrated in FIGS. 1A to 1C, a channel formation region means parts of the first oxide layer 104a, the oxide semiconductor layer 104b, and the second oxide layer 104c which are between the pair of electrode layers 108b.

[Gate Electrode Layer]

The electrode layer 109 has a structure in which the electrode layer 109a and the electrode layer 109b are stacked. Note that the electrode layer 109 may be a stack including three or more conductive layers.

For the electrode layer 109b, it is possible to use a conductive film of a metal material such as Al, Ti, Cr, Co, Ni, Cu, Y, Zr, Mo, Ru, Ag, Ta, or W, or an alloy material containing the above metal material.

For the electrode layer 109a, which is provided on the oxide semiconductor layer 104b side, the above-described conductive material which is not easily bonded to oxygen can be used. When the electrode layer 109a which is not easily bonded to oxygen is provided between the electrode layer 109b and the gate insulating layer 105, oxygen in the oxide stack 104 can be prevented from diffusing to the electrode layer 109b through the gate insulating layer 105, which leads to high reliability of the transistor.

For example, a titanium nitride film and a titanium-tungsten alloy film are used for the electrode layer 109a and the electrode layer 109b, respectively. Alternatively, a tantalum nitride film and a tungsten film are used for the electrode layer 109a and the electrode layer 109b, respectively. Further alternatively, a structure can be employed in which a titanium nitride film and a tungsten film are used for the electrode layer 109a and the electrode layer 109b, respectively, and a titanium-tungsten alloy film is included between the electrode layer 109a and the electrode layer 109b.

Note that when oxygen is not easily diffused from the gate insulating layer 105, the electrode layer 109a is not necessarily provided.

Although the electrode layers which are described in the above embodiments can be formed by a sputtering method, such layers may be formed by another method, e.g., a thermal CVD method. A metal organic chemical vapor deposition (MOCVD) method or an atomic layer deposition (ALD) method may be employed as an example of a thermal CVD method.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an SiH$_4$ gas may be used instead of a B$_2$H$_6$ gas.

The above is the descriptions of the components.

Figure 4:
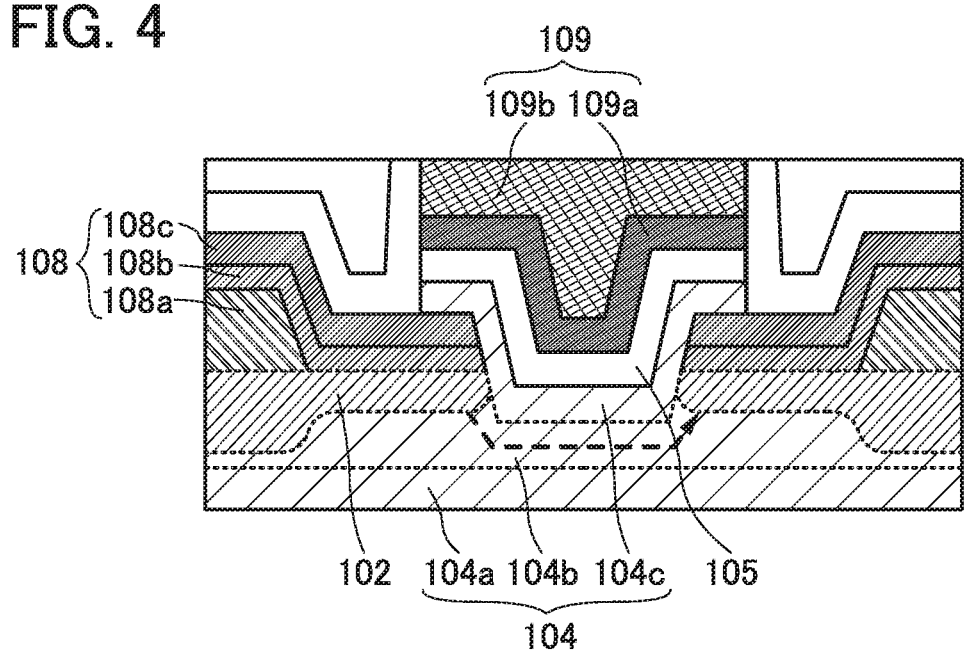
FIG. 4 illustrates a structural example of a transistor of one embodiment.

FIG. 4 is an enlarged schematic diagram illustrating the channel formation region of the transistor 100.

It is preferable that as illustrated in FIG. 4, the oxide semiconductor layer 104b be partly etched such that the top surface of the oxide semiconductor layer 104b in the channel formation region is located below the depth of the low-resistance region 102 formed in the vicinity of the channel formation region. In addition, the second oxide layer 104c is preferably formed in contact with a top surface of a thin region of the oxide semiconductor layer 104b.

Here, in the oxide semiconductor layer 104b, a region whose resistance is reduced due to extraction of oxygen by the electrode layer 108b extends not only in the depth direction but also in the channel length direction in some cases. Therefore, when the channel length is set extremely small, the pair of low-resistance regions 102 might be connected to each other to be short-circuited.

However, such short circuit between the pair of low-resistance regions 102 can be prevented when the top surface of the oxide semiconductor layer 104b is etched to be located below the depth of the low-resistance region 102 in the channel formation region as illustrated in FIG. 4.

In FIG. 4, a dashed arrow schematically illustrates a path of a current which mainly flows between the pair of electrode layers 108. The channel is mainly formed in the oxide semiconductor layer 104b, so that a current also flows mainly in the oxide semiconductor layer 104b. The larger a difference between the level of the bottom surface of the low-resistance region 102 in the vicinity of the channel formation region and the level of the top surface of the oxide semiconductor layer 104b is, the longer the channel length can be; thus, a short channel effect can be inhibited. Even a transistor in which an actual channel length is extremely short can have favorable electrical characteristics.

The channel length of the transistor of one embodiment of the present invention can be set to as short as 30 nm or less, preferably 20 nm or less, further preferably 10+X nm (X is greater than or equal to 0 and less than 10) or less.

Modification Example

In the formation process of the transistor 100, a capacitor can also be formed without an increase of the number of steps of the process.

Figure 5A:
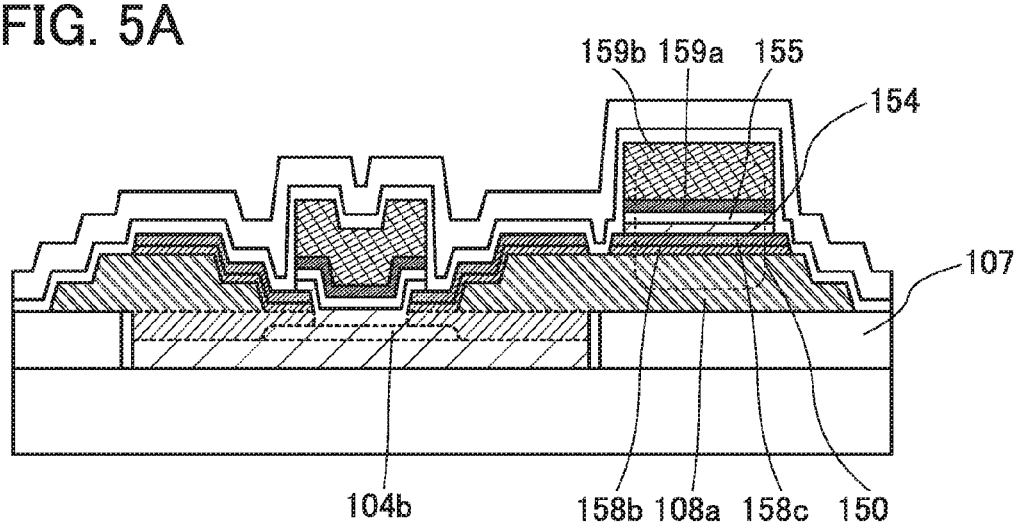
FIGS. 5A and 5B illustrate structural examples of a transistor of one embodiment.
Figure 5B:
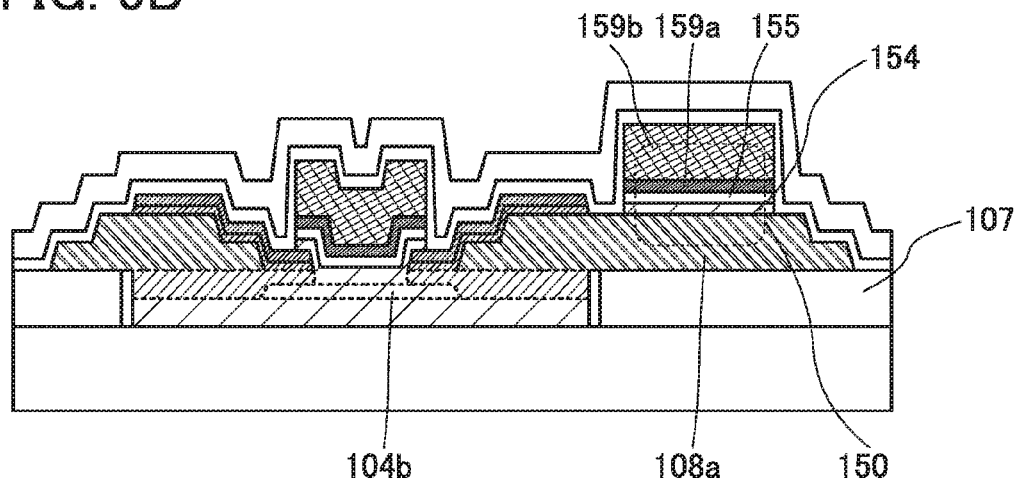

In FIGS. 5A and 5B, a structural example is illustrated in which a capacitor 150 is formed so as to be electrically connected to the transistor 100.

The capacitor 150 illustrated in FIG. 5A has a structure in which part of the electrode layer 108a, an electrode layer 158b, an electrode layer 158c, an oxide layer 154, an insulating layer 155, an electrode layer 159a, and an electrode layer 159b are stacked in order.

The electrode layer 158b can be formed by processing the same film as the electrode layer 108b. Similarly, the electrode layer 158c, the oxide layer 154, the insulating layer 155, the electrode layer 159a, and the electrode layer 159b can be formed by processing the same films as the electrode layer 108c, the second oxide layer 104c, the gate insulating layer 105, the electrode layer 109a, and the electrode layer 109b, respectively. Thus, the capacitor 150 can be formed at the same time as fabrication of the transistor 100 without an increase of the number of steps.

The capacitor 150 illustrated in FIG. 5B has a structure in which part of the electrode layer 108a, the oxide layer 154, the insulating layer 155, the electrode layer 159a, and the electrode layer 159b are stacked in order.

In each of the above structures, a stack including the oxide layer 154 and the insulating layer 155 functions as a dielectric of the capacitor.

Here, when an oxide semiconductor is used for the oxide layer 154, a relative permittivity higher than a relative permittivity of an insulator such as silicon oxide can be achieved. For example, while silicon oxide has a relative permittivity of 4.0 to 4.5, an oxide semiconductor can have a relative permittivity of 13 to 17 or 14 to 16. Therefore, without a reduction in capacitance, the thickness of the oxide layer 154 can be large and thus a withstand voltage of the capacitor can be increased.

Further, as illustrated in FIGS. 5A and 5B, the capacitor can be formed over the insulating layer 107 outside the region (also referred to as trench region) in which the oxide semiconductor layer 104b is embedded.

With such a structure, the transistor 100 and the capacitor 150 can be fabricated at the same time without an increase of the number of steps. Therefore, a semiconductor circuit including the transistor 100 and the capacitor 150 can be easily fabricated.

The above is the description of this modification example.

[Example of Fabrication Method of Transistor]

An example of a fabrication method of the transistor described above is described below with reference to the drawings.

First, the insulating layer 103 is formed over the substrate 101.

The insulating layer 103 can be formed by a plasma chemical vapor deposition (CVD) method, a sputtering method, or the like using an insulating film containing oxygen, such as an insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide.

It is preferable that the insulating layer 103 be formed with a material containing oxygen, which can supply the oxygen to at least the oxide stack 104 to be formed later. Further, the insulating layer 103 is preferably a film excessively containing oxygen.

In order to make the insulating layer 103 excessively contain oxygen, the insulating layer 103 may be formed in an oxygen atmosphere, for example. Alternatively, the insulating layer 103 may excessively contain oxygen in such a manner that oxygen is introduced into the insulating layer 103 which has been formed. Both the methods may be combined.

For example, oxygen (at least including any of oxygen radicals, oxygen atoms, and oxygen ions) is introduced into the insulating layer 103 which has been formed, whereby a region excessively containing oxygen is formed. As a method for introducing oxygen, an ion implantation method, an ion doping method, a plasma immersion ion implantation method, plasma treatment, or the like can be used.

A gas containing oxygen can be used for oxygen introducing treatment. As the gas containing oxygen, oxygen, dinitrogen monoxide, nitrogen dioxide, carbon dioxide, carbon monoxide, and the like can be used. Further, a rare gas may be contained in the gas containing oxygen in the oxygen introducing treatment.

Figure 6A:
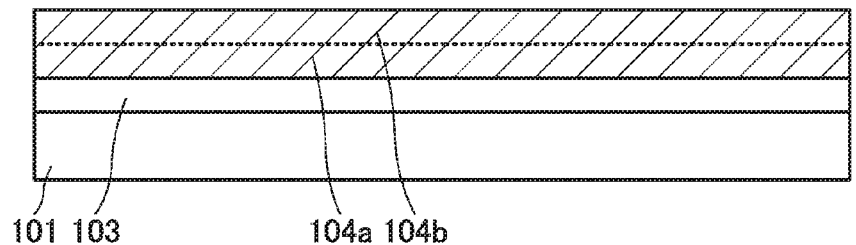
FIGS. 6A to 6E illustrate an example of a method for fabricating a transistor of one embodiment.

Then, the first oxide layer 104a and the oxide semiconductor layer 104b are formed over the insulating layer 103 by a sputtering method, a CVD method, a molecular beam epitaxy (MBE) method, an atomic layer deposition (ALD) method, or a pulsed laser deposition (PLD) method (see FIG. 6A).

For the first oxide layer 104a, the oxide semiconductor layer 104b, and the second oxide layer 104c which is to be formed later, the material described in Embodiment 1 as an example can be used.

For example, the first oxide layer 104a is preferably formed using an In—Ga—Zn oxide having an atomic ratio of In to Ga and Zn which is 1:3:2, an In—Ga—Zn oxide having an atomic ratio of In to Ga and Zn which is 1:6:4, an In—Ga—Zn oxide having an atomic ratio of In to Ga and Zn which is 1:9:6, or an oxide having a composition which is in the neighborhood of any of the above atomic ratios.

Further, for example, the oxide semiconductor layer 104b is preferably formed using an In—Ga—Zn oxide having an atomic ratio of In to Ga and Zn which is 1:1:1, an In—Ga—Zn oxide having an atomic ratio of In to Ga and Zn which is 3:1:2, or an oxide having a composition which is in the neighborhood of any of the above atomic ratios.

For example, the second oxide layer 104c is preferably formed using an In—Ga—Zn oxide having an atomic ratio of In to Ga and Zn which is 1:3:2, an In—Ga—Zn oxide having an atomic ratio of In to Ga and Zn which is 1:6:4, an In—Ga—Zn oxide having an atomic ratio of In to Ga and Zn which is 1:9:6, or an oxide having a composition which is in the neighborhood of any of the above atomic ratios.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example.

Note that the composition of each of the layers is not limited to the above atomic ratios. The indium content in the oxide semiconductor layer 104b is preferably higher than that in the first oxide layer 104a and that in the second oxide layer 104c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Further, gallium needs large formation energy of an oxygen vacancy and thus is not likely to generate an oxygen vacancy as compared to indium. Therefore, an oxide having a high gallium content has stable characteristics.

Thus, with the use of an oxide having a high indium content for the oxide semiconductor layer 104b, a transistor having high mobility can be achieved. Further, when an oxide having a high gallium content is used for on a side of an interface with each of the insulating layers, the transistor can have higher reliability.

Further, an oxide semiconductor that can be used for the first oxide layer 104a, the oxide semiconductor layer 104b, and the second oxide layer 104c preferably contains at least indium (In) or zinc (Zn). Alternatively, the oxide semiconductor preferably contains both In and Zn. Specifically, it is preferable that the oxide semiconductor layer 104b contain indium because the carrier mobility of the transistor can be increased, and the oxide semiconductor layer 104b contain zinc because a CAAC-OS film is formed easily. In order to reduce fluctuation in electrical characteristics of the transistors including the oxide semiconductor layer, the oxide semiconductor preferably contains a stabilizer in addition to indium and zinc.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given.

For example, any of the following oxides, or specifically oxide semiconductors, can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that as described in Embodiment 1 in detail, a material of the first oxide layer 104a and the second oxide layer 104c is selected so that the first oxide layer 104a and the second oxide layer 104c have higher electron affinities than that of the oxide semiconductor layer 104b.

Note that the oxide stack is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

Note that oxygen may be introduced into the first oxide layer 104a at timing which is after formation of the first oxide layer 104a and before formation of the oxide semiconductor layer 104b. By the oxygen introduction treatment, the first oxide layer 104a excessively contains oxygen, so that the excess oxygen can be supplied to the oxide semiconductor layer 104b by heat treatment in a later film formation step.

The preferable and typical amount of oxygen which is added to the first oxide layer 104a is, in the case of using an ion implantation method, a dosage higher than or equal to $5 \times 10^{14}/cm^2$ and lower than or equal to $1 \times 10^{17}/cm^2$. It is preferable that the amount of oxygen which is added be large enough to enable a reduction in oxygen vacancies in the oxide semiconductor film which is to be formed later, and the amount is typically $5 \times 10^{14}/cm^2$ or more, preferably $1 \times 10^{15}/cm^2$ or more. At the same time, the higher the amount of added oxygen, the longer the treatment time and the lower the productivity; thus, the amount is preferably $1 \times 10^{17}/cm^2$ or less, further preferably $5 \times 10^{16}/cm^2$ or less, still further preferably $2 \times 10^{16}/cm^2$ or less.

Accordingly, oxygen vacancies in the oxide semiconductor layer 104b can be suppressed more by the oxygen introduction treatment performed on the first oxide layer 104a.

Note that the crystallinity of the first oxide layer 104a is lowered by the oxygen introduction treatment in some cases. In the oxide stack 104, at least the oxide semiconductor layer 104b is preferably a CAAC-OS film. Accordingly, the oxygen introduction treatment is preferably performed at timing which is after formation of the first oxide layer 104a and before formation of the oxide semiconductor layer 104b.

Then, the stack including the first oxide layer 104a and the oxide semiconductor layer 104b is selectively etched, so that an island-like stack including the first oxide layer 104a and the oxide semiconductor layer 104b is formed. Note that heating may be performed before etching.

Figure 6B:
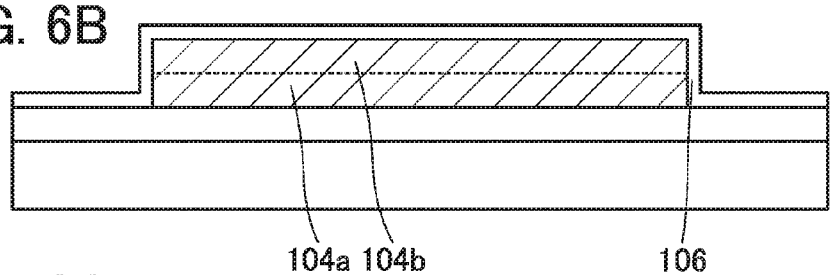

Subsequently, the oxide layer 106 is formed so as to be in contact with at least a side surface of the stack including the first oxide layer 104a and the oxide semiconductor layer 104b (FIG. 6B). The oxide layer 106 is formed by a sputtering method, a CVD method, an MBE method, an ALD method, or a PLD method.

When a material containing In and M (M is a metal such as Al, Ti, Ga, Ge, Y, Zr, Sn, La, Ce, or Hf) is used for the oxide layer 106, an oxide which contains M more than In at an atomic ratio is preferably used.

For example, the oxide layer 106 is preferably formed using an In—Ga—Zn oxide having an atomic ratio of In to Ga and Zn which is 1:3:2, an In—Ga—Zn oxide having an atomic ratio of In to Ga and Zn which is 1:6:4, an In—Ga—Zn oxide having an atomic ratio of In to Ga and Zn which is 1:9:6, or an oxide having a composition which is in the neighborhood of any of the above atomic ratios. A film of such an oxide is preferably formed by a sputtering method.

Alternatively, an oxide (e.g., gallium oxide) not containing indium can be used for the oxide layer 106. In this case, a film of the oxide is preferably formed by a CVD method.

Next, the oxide layer 106 except for that in a region in contact with the side surfaces of the first oxide layer 104a and the oxide semiconductor layer 104b is removed by etching. For example, by anisotropic etching using a dry etching method or the like, only the oxide layer 106 in the region in contact with the side surfaces of the first oxide layer 104a and the oxide semiconductor layer 104b can be left. In this manner, the oxide layer 106 in contact with the side surfaces of the first oxide layer 104a and the oxide semiconductor layer 104b can be formed.

Figure 6C:
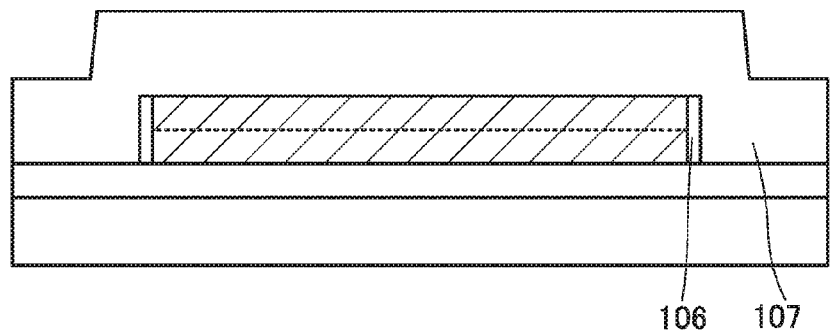

Then, the insulating layer 107 is formed so as to cover the oxide semiconductor layer 104b and the oxide layer 106 (FIG. 6C). The insulating layer 107 can be formed by a plasma CVD method, a sputtering method, or the like using an insulating film of aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, or the like.

Figure 6D:
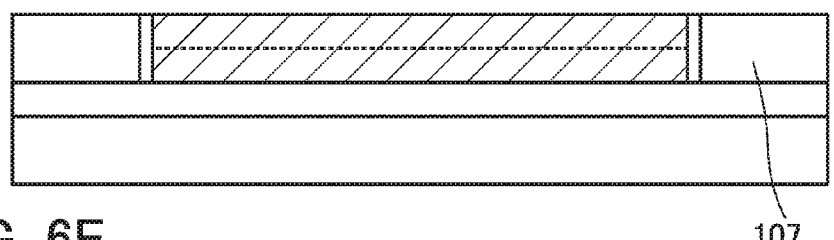

The insulating layer 107 is then subjected to planarization treatment, so that the top surface of the oxide semiconductor layer 104b is exposed (FIG. 6D). To the planarization treatment, a CMP method or the like can be applied.

In some cases, the planarization treatment causes a reduction in the thickness of the oxide semiconductor layer 104b. In that case, with a thickness reduced by the planarization treatment taken into consideration, the oxide semiconductor layer 104b having a large thickness is preferably formed in advance.

After the planarization treatment, heat treatment is preferably performed. Owing to the heat treatment, efficient oxygen supply can be performed from the insulating layer 103 to the first oxide layer 104a and the oxide semiconductor layer 104b and from the first oxide layer 104a to the oxide semiconductor layer 104b, whereby oxygen vacancies in the first oxide layer 104a and the oxide semiconductor layer 104b can be reduced. Further, by the heat treatment, the crystallinity of the first oxide layer 104a and the oxide semiconductor layer 104b can be increased, and moreover, an impurity such as hydrogen or water can be removed from at least one of the insulating layer 107, the first oxide layer 104a, the oxide semiconductor layer 104b, and the oxide layer 106.

The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidizing gas at 10 ppm or more in order to compensate desorbed oxygen.

Figure 8:
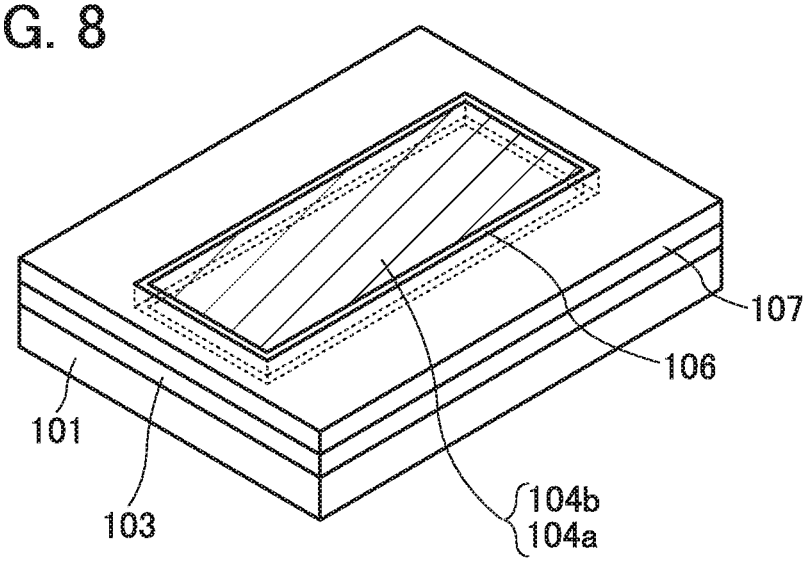
FIG. 8 illustrates an example of a method for fabricating a transistor of one embodiment.

FIG. 8 is a schematic perspective view of this stage. As illustrated in the drawing, the side surface of the island-like stack including the first oxide layer 104a and the oxide semiconductor layer 104b is covered with the oxide layer 106, and the island-like stack is embedded in the insulating layer 107. The top surfaces of the oxide semiconductor layer 104b, the oxide layer 106, and the insulating layer 107 are planarized. The levels of the top surfaces are substantially the same, or a difference between the levels is extremely small. It is thus possible to prevent an adverse effect due to a step at the time of formation of a layer over these layers. When a plurality of the above island-like stacks are provided, a distance between adjacent stacks can be made extremely small.

Then, a conductive film is formed over the oxide semiconductor layer 104b, the oxide layer 106, and the insulating layer 107 and selectively etched so as to be divided over the oxide semiconductor layer 104b; thus, the pair of electrode layers 108a are formed.

For the electrode layers 108a, Al, Cr, Cu, Ta, Ti, Mo, W, or an alloy material containing any of these as a main component can be used, for example. For example, a tungsten film is formed by a deposition method such as a sputtering method.

At this time, the end portion of the electrode layer 108a is preferably formed so as to have a staircase-like shape as illustrated in the drawing. The end portion can be formed in such a manner that a step of making a resist mask recede by ashing and an etching step are alternately performed a plurality of times. By making the end portion have a staircase-like shape, coverage with a layer (e.g., the electrode layer 108b or the electrode layer 108c) to be formed thereover can be improved, and the layer to be formed can be thus thin. In addition, the electrode layer 108a can be formed thick, whereby the resistance of the electrode can be reduced.

Note that although not shown, by overetching of the conductive film, part of the oxide semiconductor layer 104b or the insulating layer 107 (an exposed region) is etched in some cases.

Figure 6E:
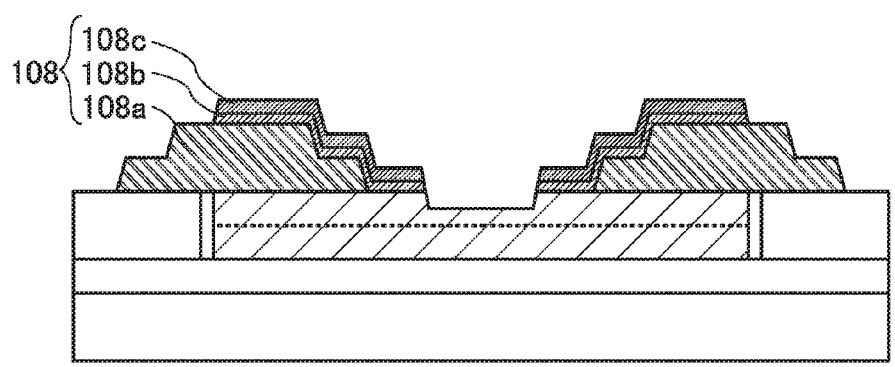

Next, over the oxide semiconductor layer 104b, the electrode layers 108a, and the insulating layer 107, a conductive film to be the electrode layers 108b and a conductive film to be the electrode layers 108c are formed and selectively etched so as to be divided over the oxide semiconductor layer 104b; thus, a pair of stacks of the electrode layers 108b and the electrode layers 108c are formed (FIG. 6E).

For the electrode layers 108b, Al, Cr, Cu, Ta, Ti, Mo, W, or an alloy material containing any of these as a main component can be used, for example. For the electrode layers 108c, it is possible to use a film of metal nitride such as tantalum nitride or titanium nitride, or a nitride film of an alloy material containing tantalum, titanium, or the like as a main component. For example, a titanium film is formed by a sputtering method and a titanium nitride film is then formed by a sputtering method.

When the electrode layers 108b and the electrode layers 108c are formed by processing the conductive films by etching, they are preferably overetched so that part of the oxide semiconductor layer 104b is etched intentionally. At this time, the oxide semiconductor layer 104b is preferably etched such that the top surface of the oxide semiconductor layer 104b is located below the depth of the low-resistance region 102 to be formed later in the vicinity of the channel formation region.

Note that with a reduction in the thickness of the oxide semiconductor layer 104b due to processing of the conductive film into the electrode layers 108a, the electrode layers 108b, and the electrode layers 108c taken into consideration, the oxide semiconductor layer 104b having a large thickness is preferably formed in advance.

Note that in the case of forming a transistor whose channel length is extremely short, at least a region to divide the stack including the conductive films to be the electrode layers 108b and the electrode layers 108c is etched using resist masks that are processed by a method suitable for fine line processing, such as electron beam exposure. Note that by the use of a positive type resist for the resist masks, the exposed region can be minimized and throughput can be thus improved. In the above manner, a transistor having a channel length of 30 nm or less can be formed. Alternatively, minute processing may be performed by an exposure technology which uses light with an extremely short wavelength (e.g., extreme ultraviolet (EUV)), X-rays, or the like.

Then, the second oxide layer 104c is formed over the oxide semiconductor layer 104b, the electrode layers 108a, the electrode layers 108c, and the insulating layer 107. The second oxide layer 104c is formed by a sputtering method, a CVD method, an MBE method, an ALD method, or a PLD method using the above-described material.

Here, oxygen is preferably introduced into the second oxide layer 104c at timing which is after formation of the second oxide layer 104c. By the oxygen introduction treatment, the second oxide layer 104c excessively contains oxygen, so that the excess oxygen can be supplied to the oxide semiconductor layer 104b by heat treatment in a later film formation step.

The preferable and typical amount of oxygen which is added to the second oxide layer 104c is, in the case of using an ion implantation method, a dosage higher than or equal to $5\times10^{14}/cm^2$ and lower than or equal to $1\times10^{17}/cm^2$. It is preferable that the amount of oxygen which is added be large enough to enable a reduction in oxygen vacancies in the oxide semiconductor film which is to be formed later, and the amount is typically $5\times10^{14}/cm^2$ or more, preferably $1\times10^{15}/cm^2$ or more. At the same time, the higher the amount of added oxygen, the longer the treatment time and the lower the productivity; thus, the amount is preferably $1\times10^{17}/cm^2$ or less, further preferably $5\times10^{16}/cm^2$ or less, still further preferably $2\times10^{16}/cm^2$ or less.

Figure 7A:
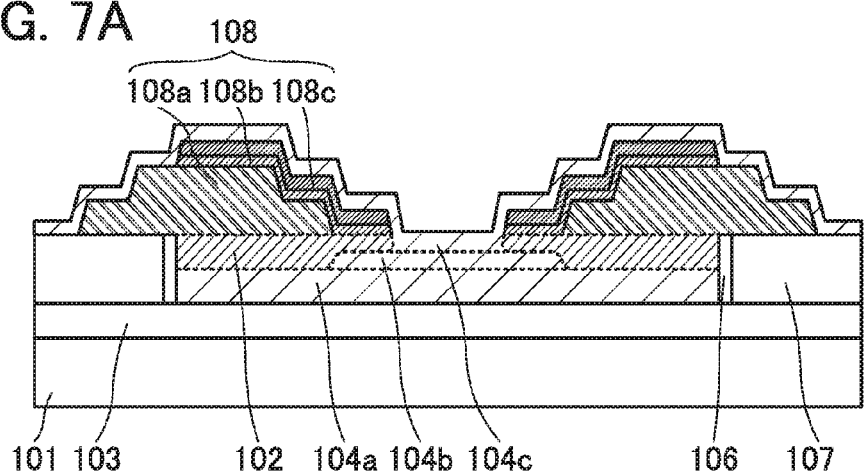
FIGS. 7A to 7C illustrate an example of a method for fabricating a transistor of one embodiment.

Next, heat treatment is performed, so that the low-resistance regions 102 are formed (FIG. 7A). When the heat treatment is performed in a state where the electrode layers 108a are in contact with the oxide semiconductor layer 104b, oxygen in the stack including the oxide semiconductor layer 104b and the first oxide layer 104a is taken into the electrode layers 108a which are easily bonded to oxygen. Accordingly, oxygen vacancies are generated in regions of the oxide semiconductor layer 104b which are in the vicinities of the interfaces with the electrode layers 108a, so that the low-resistance regions 102 are formed. Similarly, by the heat treatment, the low-resistance regions 102 are formed in regions of the oxide semiconductor layer 104b which are in the vicinities of the interfaces with the electrode layers 108b.

Here, in accordance with the thickness, material, and the like of the electrode layer 108a and the electrode layer 108b, the depth of the low-resistance region 102, which is formed thereunder, is determined. The depth can also be controlled in accordance with conditions of the heat treatment (temperature, time, pressure, or the like). For example, the higher the heating temperature or the longer the heating time, the larger the depth of the low-resistance region 102. Note that the low-resistance region 102 is not formed in some cases depending on the temperature of the heat treatment.

The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidizing gas at 10 ppm or more in order to compensate desorbed oxygen.

By the heat treatment, efficient oxygen supply can be performed from the second oxide layer 104c to the oxide semiconductor layer 104b, whereby oxygen vacancies in the oxide semiconductor layer 104b can be reduced. Further, by the heat treatment, the crystallinity of the first oxide layer 104a, the oxide semiconductor layer 104b, and the second oxide layer 104c can be increased, and moreover, an impurity such as hydrogen or water can be removed from at least one of the insulating layer 107, the first oxide layer 104a, the oxide semiconductor layer 104b, the second oxide layer 104c, and the oxide layer 106.

Next, the gate insulating layer 105 is formed over the second oxide layer 104c. The gate insulating layer 105 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. Note that the gate insulating layer 105 may be a stacked layer of any of the above materials. The gate insulating layer 105 can be formed by a sputtering method, a CVD method, an MBE method, an ALD method, a PLD method, or the like. In particular, it is preferable that the gate insulating layer 105 be formed by a CVD method, further preferably a plasma CVD method, because favorable coverage can be achieved.

After the formation of the gate insulating layer 105, heat treatment is preferably performed. By the heat treatment, an impurity such as water or hydrogen contained in the gate insulating layer 105 can be desorbed (dehydration or dehydrogenation can be performed). The temperature of the heat treatment is preferably higher than or equal to 300° C. and lower than or equal to 400° C. The heat treatment may be performed in such a manner that heat treatment is performed in an inert gas atmosphere, and then another heat treatment is performed in an atmosphere containing an oxidizing gas at 10 ppm or more in order to compensate desorbed oxygen. By the heat treatment, an impurity such as hydrogen or water can be removed from the gate insulating layer 105. In addition, impurities such as hydrogen and water are further removed from the first oxide layer 104a, the oxide semiconductor layer 104b, and the second oxide layer 104c in some cases. Further, when the heat treatment is performed in an atmosphere containing an oxidizing gas, oxygen can be supplied to the gate insulating layer 105.

Note that it is preferable that the heat treatment be successively performed in a deposition chamber after the gate insulating layer 105 is formed. Alternatively, the heating at the time of forming the gate insulating layer 105 can serve as the heat treatment.

Then, a conductive film to be the electrode layer 109a and a conductive film to be the electrode layer 109b are formed in order. The conductive films can be formed by a sputtering method or the like.

Figure 7B:
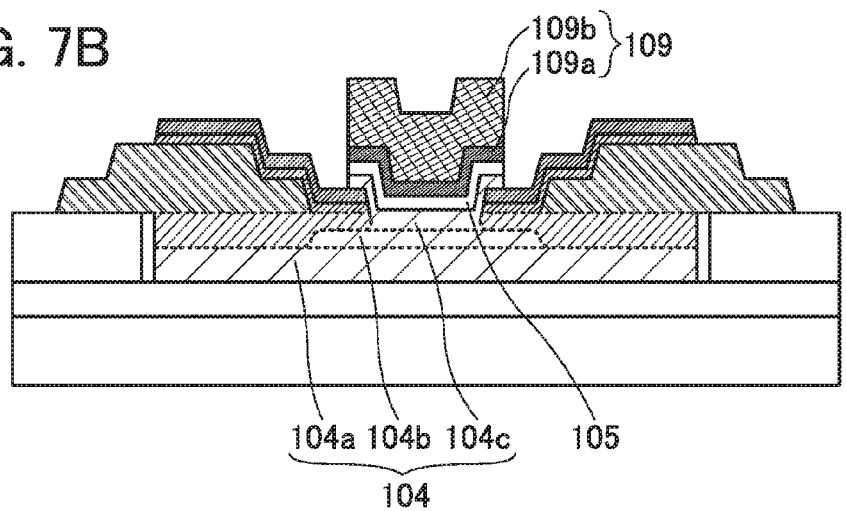

Next, the conductive film to be the electrode layer 109b, the conductive film to be the electrode layer 109a, the gate insulating layer 105, and the second oxide layer 104c are selectively etched so as to overlap with the channel formation region, so that a stack including the second oxide layer 104c, the gate insulating layer 105, the electrode layer 109a, and the electrode layer 109b is formed (FIG. 7B).

Here, in the above etching step, the electrode layers 108b and the electrode layers 108c can serve as etching stoppers.

Note that heat treatment may be performed after the conductive film to be the electrode layer 109a and the conductive film to be the electrode layer 109b are formed, or after the above etching step. To the heat treatment, the conditions of the heat treatment which can be performed after the formation of the gate insulating layer 105 can be applied.

Here, the heat treatment for the formation of the low-resistance regions 102 is not necessarily performed just after the second oxide layer 104c is formed and may be performed at any timing after the second oxide layer 104c is formed. The low-resistance regions 102 can be formed by performing heat treatment at least once. When heat treatment is performed a plurality of times, oxygen vacancies in the oxide stack 104 can be reduced more effectively.

Figure 7C:
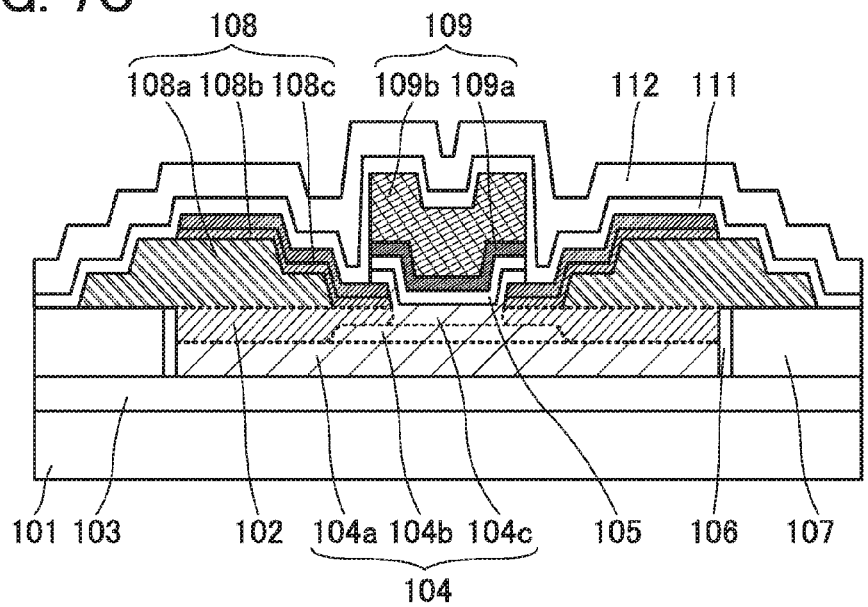

Then, the insulating layer 111 and the insulating layer 112 are formed in order over the insulating layer 107, the electrode layers 108, and the electrode layer 109 (FIG. 7C).

It is preferable that the insulating layer 111 be formed with a material containing oxygen, which can supply the oxygen to the oxide stack 104. Further, the insulating layer 111 is preferably a film containing excess oxygen. To the formation of the insulating layer 111, a material and a method similar to those of the insulating layer 103 can be applied.

Further, the insulating layer 112 is preferably formed using an insulating film with a low oxygen-transmitting property (or with an oxygen barrier property). For example, a nitride such as silicon nitride or silicon nitride oxide is preferably used. The insulating layer can be formed by a method such as a plasma CVD method or a sputtering method. It is preferable that the insulating layer 112 be formed by a sputtering method because the concentration of hydrogen in the insulating layer 112 is preferably reduced. The concentration of hydrogen in the insulating layer 112 is preferably lower than $5 \times 10^{19}$ atoms/cm$^3$, further preferably lower than $5 \times 10^{18}$ atoms/cm$^3$.

Further, heat treatment may be performed after the formation of the insulating layer 112. For example, the heat treatment is performed under conditions of the heat treatment which can be performed after the formation of the gate insulating layer 105, whereby oxygen can be supplied from the insulating layer 111 to the channel formation region.

In this manner, the transistor 100 in this embodiment can be fabricated.

The above is the description of this fabrication method.

Modification Example 1

An example which is partly different from the above fabrication method of the transistor is described below. Specifically, in this modification example, steps up to and including the formation step of the insulating layer 107 in the above-described example of the fabrication method of the transistor are described.

First, in a manner similar to the above, the insulating layer 103, the first oxide layer 104a, and the oxide semiconductor layer 104b are formed over the substrate 101.

Figure 9A:
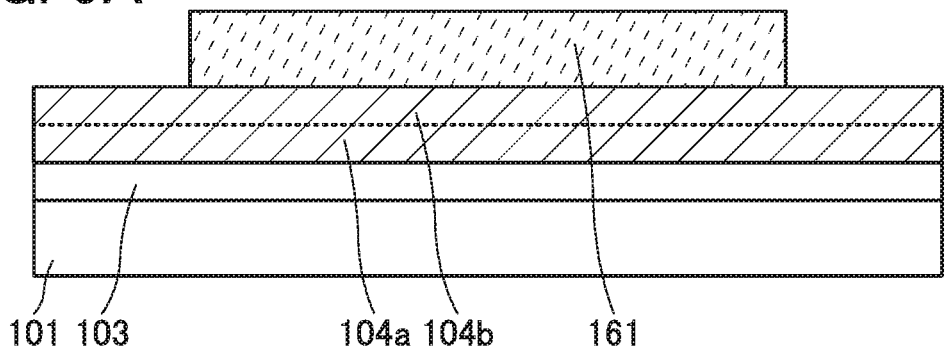
FIGS. 9A to 9D illustrate an example of a method for fabricating a transistor of one embodiment.

Over the oxide semiconductor layer 104b, a resist mask 161 is formed (FIG. 9A). The resist mask 161 can be formed by photolithography.

Then, the oxide semiconductor layer 104b in a region where the resist mask 161 is not provided is etched by a dry etching method, so that the first oxide layer 104a is exposed.

Figure 9B:
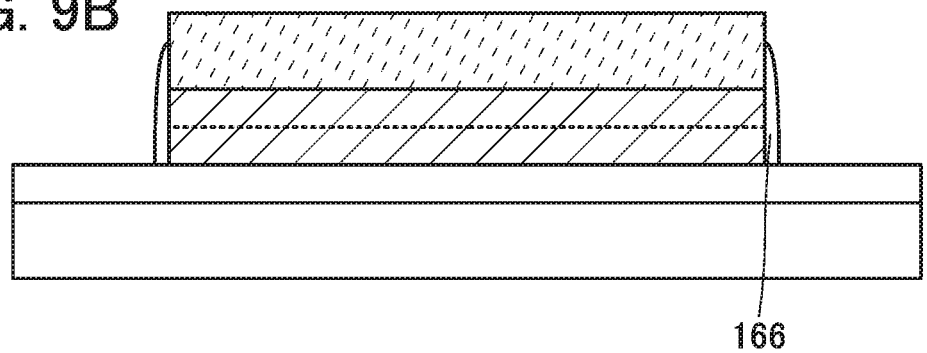

After that, the first oxide layer 104a which is exposed is etched by a dry etching method. At this time, a reaction product of the first oxide layer 104a is attached to side surfaces of the first oxide layer 104a, the oxide semiconductor layer 104b, and the resist mask 161 to form an oxide layer 166 serving as a sidewall protective layer (also referred to as a sidewall oxide layer or a rabbit ear) (FIG. 9B). Note that the reaction product of the first oxide layer 104a is attached by a sputtering phenomenon or through plasma at the time of the dry etching. The dry etching may be performed under the following conditions, for example: a boron trichloride gas and a chlorine gas are used as etching gases, and inductively coupled plasma (ICP) power and substrate bias power are applied.

Since the oxide layer 166 is formed of the reaction product of the first oxide layer 104a, main components of the oxide layer 166 are the same as components of the first oxide layer 104a.

At this time, the insulating layer 103 might be also partly etched, in which case the oxide layer 166 contains components of the insulating layer 103 (e.g., silicon).

Note that since the oxide layer 166 is formed of the reaction product of the first oxide layer 104a, components of the etching gas used at the time of etching (e.g., chlorine and boron) remain therein in some cases.

Then, the resist mask 161 is removed.

Figure 9C:
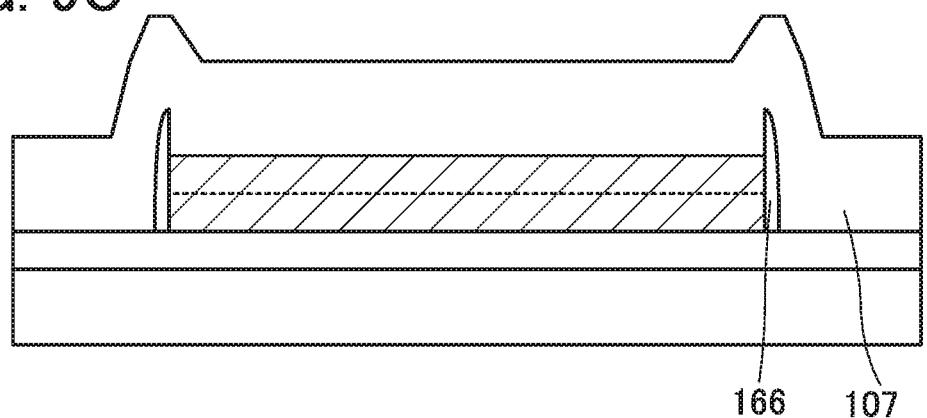

Then, the insulating layer 107 is formed so as to cover the oxide semiconductor layer 104b and the oxide layer 166 (FIG. 9C). The insulating layer 107 may be formed in a manner similar to the above.

Figure 9D:
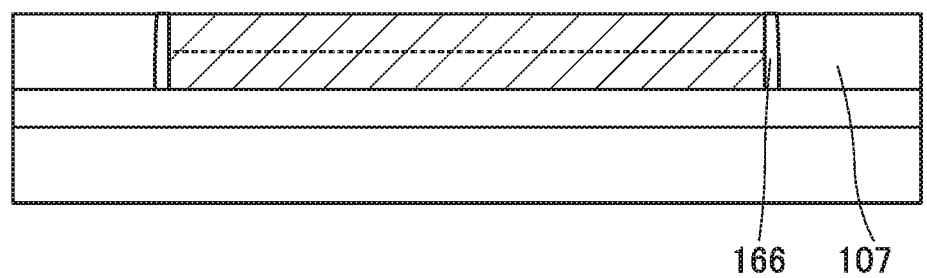

The insulating layer 107 is then subjected to planarization treatment, so that the top surface of the oxide semiconductor layer 104b is exposed (FIG. 9D).

At this time, a part of the oxide layer 166 which protrudes above the top surface of the oxide semiconductor layer 104b is also subjected to the planarization treatment, whereby the levels of top surfaces the insulating layer 107, the oxide layer 166, and the oxide semiconductor layer 104b can be substantially the same.

In this manner, a structure can be provided which includes the oxide semiconductor layer 104b (and the first oxide layer 104a) embedded in the insulating layer 107, and the oxide layer 166 surrounding the side surfaces of the oxide semiconductor layer 104b and the first oxide layer 104a.

The above-described fabrication method of the transistor is applied to the subsequent steps; accordingly, a highly reliable transistor can be fabricated.

The above is the description of this modification example.

In the fabrication method described in this modification example, it is possible to skip steps of film formation and etching which are performed to form the oxide layer in contact with the side surfaces of the oxide semiconductor layer 104b and the first oxide layer 104a, so that the process can be simplified.

Modification Example 2

An example of a fabrication method of a transistor which is partly different from the above fabrication method is described below. Specifically, in this modification example, in a manner similar to Modification Example 1, steps up to and including the formation step of the insulating layer 107 in the above-described example of the method for fabricating the transistor are described.

First, in a manner similar to the above, the insulating layer 103, the first oxide layer 104a, and the oxide semiconductor layer 104b are formed over the substrate 101.

Figure 10A:
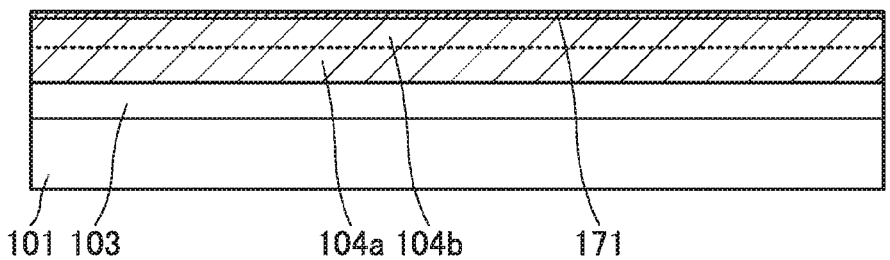
FIGS. 10A to 10E illustrate an example of a method for fabricating a transistor of one embodiment.

A barrier layer 171 is formed over the oxide semiconductor layer 104b (FIG. 10A).

The barrier layer 171 has a function of preventing the oxide semiconductor layer 104b from being etched by planarization treatment to be performed later.

For the barrier layer 171, a material resistant to the planarization treatment is selected. Any of an insulator, a conductor, and a semiconductor can be used since the barrier layer 171 is removed later by etching. For example, a film formed by a sputtering method or a CVD method using silicon nitride or aluminum oxide may be used.

A stack including the first oxide layer 104a, the oxide semiconductor layer 104b, and the barrier layer 171 is selectively etched to be processed into an island-like shape.

Figure 10B:
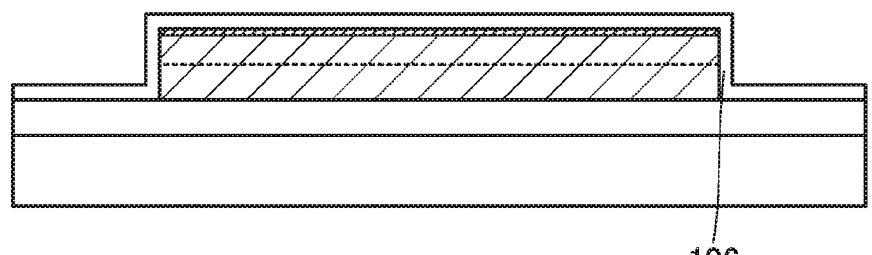

Next, the oxide layer 106 is formed by a method similar to the above-described method (FIG. 10B).

Then, the oxide layer 106 except for that in a region in contact with side surfaces of the first oxide layer 104a, the oxide semiconductor layer 104b, and the barrier layer 171 is removed by anisotropic etching, so that the oxide layer 106 which is in contact with a side surface of the stack including the first oxide layer 104a, the oxide semiconductor layer 104b, and the barrier layer 171 is formed.

Figure 10C:
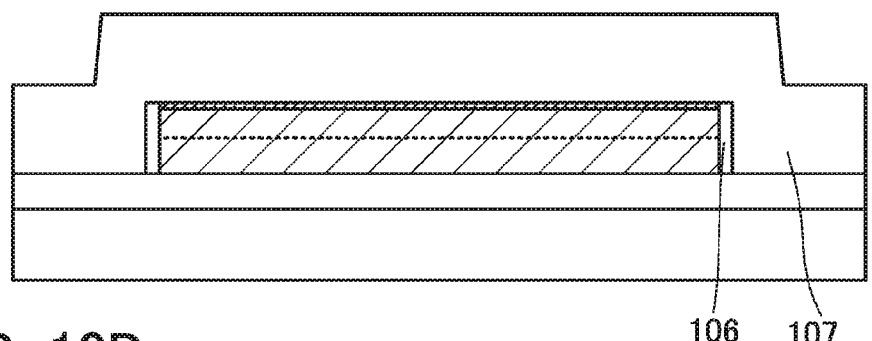

After that, by a method similar to the above-described method, the insulating layer 107 is formed so as to cover the oxide layer 106 and the barrier layer 171 (FIG. 10C).

Figure 10D:
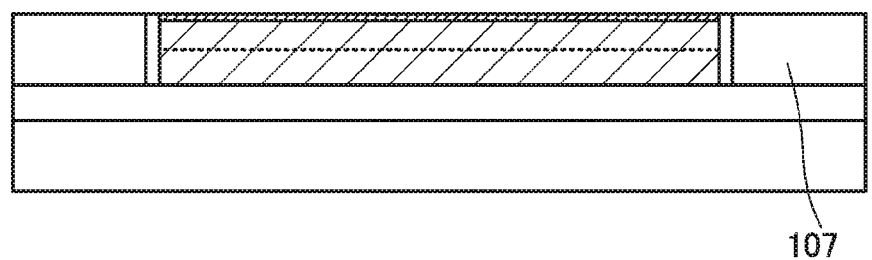

Then, the insulating layer 107 is subjected to planarization treatment, so that top surfaces of the barrier layer 171 and the oxide layer 106 are exposed (FIG. 10D).

At this time, since the barrier layer 171 is provided over the oxide semiconductor layer 104b, a reduction in the thickness of the oxide semiconductor layer 104b due to the planarization treatment can be prevented. In addition, owing to the barrier layer 171, the degree of freedom in setting conditions of the planarization treatment can be increased.

Figure 10E:
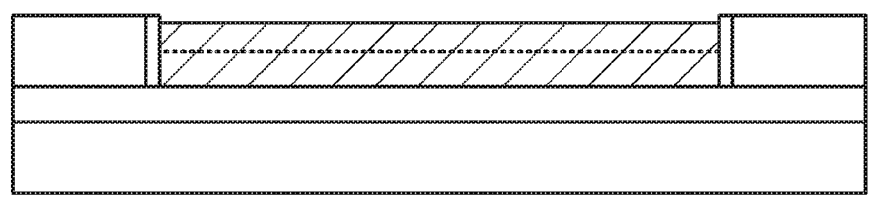

Then, the barrier layer 171 is removed by etching (FIG. 10E). At the time of removing the barrier layer 171, the conditions are preferably set such that at least the oxide semiconductor layer 104b is not easily etched.

In this manner, a structure can be provided which includes the oxide semiconductor layer 104b (and the first oxide layer 104a) embedded in the insulating layer 107, and the oxide layer 106 surrounding the side surfaces of the oxide semiconductor layer 104b and the first oxide layer 104a.

Here, the top surface of the oxide semiconductor layer 104b is located below the top surfaces of the oxide layer 106 and the insulating layer 107 after the removal of the barrier layer 171, whereby a step is formed between the oxide semiconductor layer 104b and the oxide layer 106 in some cases. Thus, in order to reduce an adverse effect on coverage with a layer to be provided over the oxide semiconductor layer 104b and the oxide layer 106, the thickness of the barrier layer 171 is preferably small. The barrier layer 171 is preferably formed as thin as possible, as long as the barrier layer is resistant to the planarization treatment. The thickness may be greater than or equal to 0.1 nm and less than or equal to 10 nm, preferably greater than or equal to 1 nm and less than or equal to 5 nm, further preferably greater than or equal to 1 nm and less than or equal to 3 nm. When the barrier layer 171 is formed thin, damage to the oxide semiconductor layer 104b at the time of etching of the barrier layer 171 can be reduced.

The above-described fabrication method of the transistor is applied to the subsequent steps; accordingly, a highly reliable transistor can be fabricated.

Note that the oxide layer in contact with the side surfaces of the oxide semiconductor layer 104b and the first oxide layer 104a can also be formed by the method described in Modification Example 1. In that case, at the same time as processing of the first oxide layer 104a, the oxide semiconductor layer 104b, and the barrier layer 171 into an island-like shape, the oxide layer in contact with the side surfaces of the first oxide layer 104a, the oxide semiconductor layer 104b, and the barrier layer 171 may be formed.

The above is the description of this modification example.

By the fabrication method described in this modification example, a reduction in the thickness of the oxide semiconductor layer 104b due to the planarization treatment can be inhibited. Further, the top surface of the oxide semiconductor layer 104b is not directly processed by planarization treatment; thus, physical, chemical, or thermal damage to the oxide semiconductor layer 104b can be reduced. Therefore, by application of such a method, a transistor with excellent electrical characteristics and improved reliability can be provided.

This embodiment can be combined with any of the other embodiments disclosed in this specification as appropriate.

Embodiment 3

In this embodiment, a semiconductor device of one embodiment of the present invention which includes the transistor described in the above embodiment will be described with reference to the drawing.

The semiconductor device in this embodiment includes a plurality of transistors, including the transistor described in the above embodiment. At least one of the plurality of transistors is stacked in the longitudinal direction in order to increase the degree of integration.

[Structural Example 1 of Semiconductor Device]

Figure 15A:
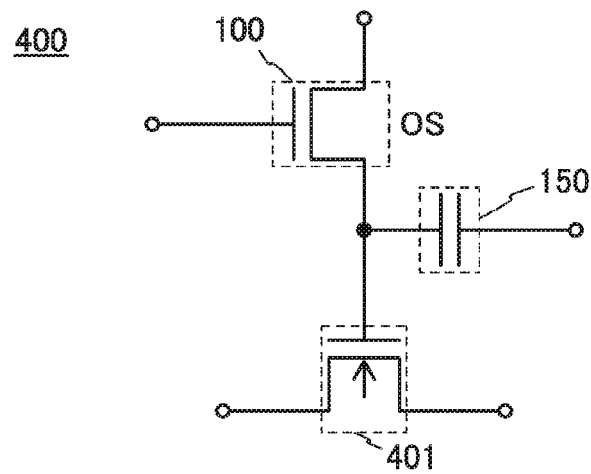
FIGS. 15A and 15B are a circuit diagram and a cross-sectional view illustrating a semiconductor device of one embodiment.

FIG. 15A is a circuit diagram of a semiconductor device 400 which is described in this embodiment. The semiconductor device 400 includes the transistor 100 and the capacitor 150 which are described in the above embodiment, and a transistor 401.

The connection relation in the semiconductor device 400 is as follows. A gate of the transistor 401 is electrically connected to one electrode of the capacitor 150 and the source or the drain of the transistor 100.

Another circuit element (e.g., a transistor or a capacitor) may be electrically connected to any of a gate of the transistor 100, the source or the drain of the transistor 100, the other electrode of the capacitor 150, and a source and a drain of the transistor 401.

The transistor 100 is an n-channel transistor which includes an oxide semiconductor, as described in the above embodiment.

The transistor 401 is an n-channel transistor which includes a semiconductor material other than an oxide semiconductor. For example, a compound semiconductor such as a silicon-based semiconductor, a germanium-based semiconductor, gallium arsenide, or gallium nitride can be used. By the use of a single crystal substrate, a polycrystalline substrate, a silicon on insulator (SOI) substrate, or the like for the transistor 401, a transistor which operates at high speed can be easily fabricated.

The transistor 100 includes an oxide semiconductor, and at least in its channel formation region, high purity is achieved by sufficient removal of impurities such as hydrogen and oxygen vacancies are reduced; thus, an off-state current (also referred to as leakage current or off leakage current) of the transistor is reduced.

In addition, since an off-state current of the transistor 100 is extremely low, electric charge can be held between the source or the drain of the transistor 100, one electrode of the capacitor 150, and the gate of the transistor 401. In other words, the semiconductor device 400 can function as a semiconductor memory device.

In the semiconductor device 400, since the transistor 100 includes the oxide semiconductor, power consumption is small as compared to the case where the semiconductor device illustrated in the circuit diagram in FIG. 15A is all formed using a semiconductor material other than an oxide semiconductor.

Figure 15B:
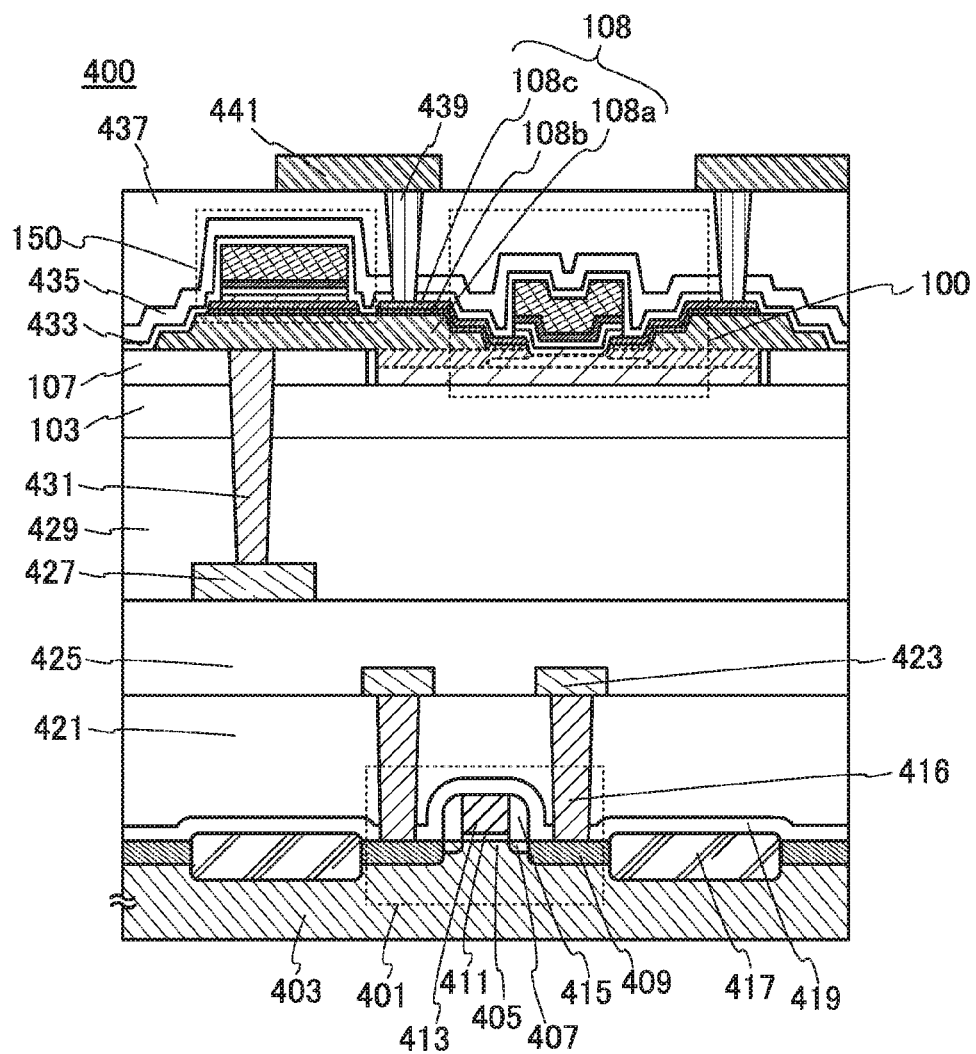

FIG. 15B is a cross-sectional view illustrating a cross-sectional structure of the semiconductor device 400.

In the semiconductor device 400, the transistor 100 and the capacitor 150 are stacked over the transistor 401 with interlayer insulating layers provided therebetween. Details of the semiconductor device 400 are described below.

The transistor 401 can be formed using a substrate 403, which includes a semiconductor material. Here, a single crystal silicon substrate having p-type conductivity is used, and the channel formation region of the transistor 401 is formed in the substrate 403. Note that the substrate 403 is not limited to a single crystal silicon substrate having p-type conductivity and can be a single crystal silicon substrate having n-type conductivity, an SOI substrate, a glass substrate on which polycrystalline silicon is formed, or the like.

The transistor 401 includes a channel formation region 405 which is provided in the substrate 403; impurity regions 407 between which the channel formation region 405 is sandwiched; high-concentration impurity regions 409 which are electrically connected to the impurity regions 407 (the impurity regions 407 and the high-concentration impurity regions 409 are also referred to as impurity regions collectively); a gate insulating layer 411 which is provided over the channel formation region 405; a gate electrode layer 413 which is provided over the gate insulating layer 411; and sidewall insulating layers 415 which are provided on side surfaces of the gate electrode layer 413.

An insulating layer 419 is provided over the transistor 401, and an interlayer insulating layer 421 is provided over the insulating layer 419. An opening reaching the high-concentration impurity region 409 is provided in the insulating layer 419 and the interlayer insulating layer 421. In the opening, a source electrode layer or a drain electrode layer (hereinafter referred to as an electrode layer 416) of the transistor 401 is provided.

A wiring layer 423 is provided in contact with the electrode layer 416. The wiring layer 423 is provided in contact with the source electrode layer or the drain electrode layer to function as a source wiring or a drain wiring. The wiring layer 423 is electrically connected to other elements which are included in the semiconductor device 400, other devices, or the like.

In addition, element isolation insulating layers 417 are provided on the substrate 403 so as to surround the transistor 401. The insulating layer 419 is provided so as to cover the transistor 401 and the element isolation insulating layers 417.

The impurity region 407 functions as an LDD region or an extension region. The high-concentration impurity region 409 functions as a source region or a drain region of the transistor 401.

An interlayer insulating layer 425 is provided over the interlayer insulating layer 421. A wiring layer 427 is provided over the interlayer insulating layer 425. The wiring layer 427 functions as a wiring. The wiring layer 427 is electrically connected to a gate wiring (not illustrated) which is electrically connected to the gate electrode layer 413 through an opening (not illustrated) which is formed in the insulating layer 419, the interlayer insulating layer 421, and the interlayer insulating layer 425. The gate wiring is provided over the gate insulating layer 411 and branches to be the gate electrode layer 413.

An interlayer insulating layer 429 is provided over the interlayer insulating layer 425 and the wiring layer 427. The transistor 100 and the capacitor 150 are provided over the interlayer insulating layer 429. Note that for details of the transistor 100 and the capacitor 150, the above embodiment can be referred to.

An electrode layer 431 is provided so as to penetrate the interlayer insulating layer 429, the insulating layer 103, and the insulating layer 107 and to be in contact with the wiring layer 427 and the electrode layer 108a of the transistor 100, which also functions as one electrode of the capacitor 150.

Note that in the semiconductor device 400, an insulating layer 433 is provided over the transistor 100 and an insulating layer 435 is provided over the insulating layer 433. An interlayer insulating layer 437 is provided over the insulating layer 435. An opening reaching the electrode layer 108c of the transistor 100 is provided in the insulating layer 433, the insulating layer 435, and the interlayer insulating layer 437, and in the opening, an electrode layer 439 is provided. A wiring layer 441 is provided in contact with the electrode layer 439. At least the wiring layer 441 functions as a source wiring or a drain wiring of the transistor 100.

Here, a fabrication method of the transistor 401 is described.

The element isolation insulating layers 417 are formed over the substrate 403 that is the single crystal silicon substrate having p-type conductivity. For example, the element isolation insulating layers 417 are formed as follows: a protective layer is formed over the substrate 403, and etching treatment is performed using the protective layer as a mask to remove the substrate 403 in regions which are not covered with the protective layer (exposed regions), whereby recessed portions are formed. For the etching treatment, dry etching is preferably performed, but wet etching may be performed. An etching gas and an etchant can be selected as appropriate depending on a material to be etched. Then, an insulating film is formed so as to cover the substrate 403 and the insulating film which are formed in regions except the recessed portions are selectively removed, whereby the element isolation insulating layers 417 can be formed. The insulating film can be formed using a silicon oxide film, a silicon nitride film, a silicon nitride oxide film, or the like. Polishing treatment such as chemical mechanical polishing (CMP), etching treatment, or the like can be employed as a way to remove the insulating film. Note that the protective layer is removed after the recessed portions are formed or after the element isolation insulating layers 417 are formed. Further, it is preferable that after the polishing treatment such as CMP or the etching treatment, cleaning treatment be performed and heat treatment for removing moisture attached onto a surface to be processed be performed.

Note that also in the fabrication process after the formation of the element isolation insulating layers 417, the cleaning treatment and the heat treatment are preferably performed to remove moisture when polishing treatment such as CMP or etching treatment is performed.

Note that the element isolation insulating layers 417 can also be formed using an element isolation technique such as local oxidation of silicon (LOCOS).

Note that a p-well may be formed by addition of an impurity element imparting p-type conductivity to a region where the transistor 401 is formed. As the impurity element imparting p-type conductivity, boron (B), aluminum (Al), gallium (Ga), or the like can be used. Addition of the impurity element can be performed by an ion doping method, an ion implantation method, or the like.

In the case of using a single crystal silicon substrate having n-type conductivity as the substrate 403, an impurity element imparting p-type conductivity may be added to form a p-well. In that case, the channel formation region 405 of the transistor 401 is formed in the p-well.

Then, an insulating film is formed over the substrate 403 where the element isolation insulating layers 417 are formed; a conductive film is formed over the insulating film and processed to form the gate electrode layer 413. With the use of the gate electrode layer 413 as a mask, the insulating film is processed to form the gate insulating layer 411. The gate insulating layer 411 can be formed using an insulating film and a formation method thereof that are applicable to the gate insulating layer 105 of the transistor 100 as appropriate. The gate electrode layer 413 can be formed using a conductive film and a formation method thereof that are applicable to the electrode layer 109 of the transistor 100 as appropriate.

Alternatively, the insulating film processed into the gate insulating layer 411 may be formed in such a manner that the surface of the substrate 403 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen.

Next, a protective layer is provided over the element isolation insulating layers 417, and an impurity element imparting n-type conductivity is added with the use of the protective layer and the gate electrode layer 413 as masks, so that the impurity regions are formed. Note that by the formation of the impurity regions, a region of the substrate 403 which is located below the gate electrode layer 413 serves as the channel formation region 405 of the transistor 401 (see FIG. 15B). The concentration of the added impurity can be set as appropriate; the concentration is preferably raised in accordance with the degree of miniaturization of the semiconductor element. Alternatively, the impurity element may be added through an insulating film (an insulating film to be processed into the sidewall insulating layers 415) which is formed so as to cover the gate electrode layer 413. Note that the protective layer is removed after the impurity element is added.

Next, the sidewall insulating layers 415 are formed. The insulating film is formed so as to cover the gate electrode layer 413 and is then subjected to highly anisotropic etching, whereby the sidewall insulating layers 415 can be formed in a self-aligned manner.

Next, an insulating film to be processed into the insulating layer 419 is formed so as to cover the gate electrode layer 413, the impurity regions, the sidewall insulating layers 415, and the like. Then, a protective layer is formed over the element isolation insulating layers 417, and an impurity element imparting n-type conductivity is added to the impurity regions using the protective layer, the gate electrode layer 413, and the sidewall insulating layers 415 as masks, whereby the impurity regions 407 and the high-concentration impurity regions 409 are formed. Note that the impurity element may be added before the insulating film to be processed into the insulating layer 419 is formed, and then the insulating film may be formed. Note that the protective layer is removed after the impurity regions are formed.

Note that the semiconductor device that is one embodiment of the present invention is not limited to the semiconductor device 400 illustrated in FIG. 15B. For example, transistors including silicide (salicide) or transistors without sidewalls may be used as the transistor 401. When a structure that contains silicide (salicide) is used, the resistance of a source region and a drain region can be further lowered and the operating speed of the semiconductor device can be increased. Further, the semiconductor device can be operated at a low voltage; thus, power consumption of the semiconductor device can be reduced. Examples of a metal material with which silicide can be formed include titanium, tantalum, tungsten, nickel, cobalt, and platinum.

Then, an insulating film to be processed into the interlayer insulating layer 421 is formed over the insulating film to be processed into the insulating layer 419, and these insulating films are processed, so that openings reaching the high-concentration impurity regions 409 are formed in the insulating layer 419 and the interlayer insulating layer 421. After that, a conductive film is formed in the openings and processed, whereby the electrode layers 416 are formed. The insulating layer 419, the interlayer insulating layer 421, and the openings can be formed by dry etching or the like, and the electrode layers 416 can be formed by polishing treatment such as CMP. The electrode layers 416 are formed by the polishing treatment or the like, whereby the insulating layer 419 and the interlayer insulating layer 421 can be planarized. Note that the electrode layers 416 may be formed by a combination of dry etching or the like with polishing treatment.

For the interlayer insulating layer 421, an inorganic insulating film or an organic insulating film can be used. Examples of the inorganic insulating film include a silicon oxide film, a silicon oxynitride film, an aluminum oxide film, and the like. Examples of the organic insulating film include films of an acrylic resin, polyimide, a benzocyclobutene-based resin, polyamide, an epoxy resin, a siloxane-based resin, and the like. Note that the interlayer insulating layer 421 may be a stack including two or more of these insulating films. There is no particular limitation on the method for forming the inorganic insulating film or the organic insulating film and the method may be selected as appropriate in accordance with the material to be used. For example, a CVD method, a sputtering method, spin coating, dipping, spray coating, a droplet discharge method (such as an inkjet method), screen printing, offset printing, or the like can be employed.

In the case where miniaturization of a semiconductor element such as a transistor included in a semiconductor device is advanced, parasitic capacitance between wirings is significant and thus signal delay is increased. In some cases, the parasitic capacitance cannot be sufficiently inhibited with silicon oxide having a dielectric constant of 4.0 to 4.5; thus, a material with k of 3.0 or less is preferably used for forming the interlayer insulating layer 421. Further, mechanical strength is required for the interlayer insulating layer 421 because planarization or the like is to be performed thereon. The interlayer insulating layer 421 can be made porous to have a lower dielectric constant as long as the mechanical strength can be secured.

It is preferable that the electrode layers 416 each have a structure in which part of the electrode layer is embedded in the interlayer insulating layer 421 like a damascene structure. The electrode layers 416 can be formed using a conductive film and a formation method thereof that are applicable to the electrode layer 108 and the electrode layer 109 of the transistor 100.

Note that in the case where the electrode layers 416 are formed, processing is preferably performed so that the surfaces thereof are planarized. For example, when a thin titanium film or a thin titanium nitride film is formed in a region including the openings and then a tungsten film is formed so as to be embedded in the openings, an excess tungsten film, an excess titanium film, an excess titanium nitride film, or the like can be removed and the planarity of the surface of the electrode layer 416 can be improved by the subsequent CMP.

Then, the wiring layers 423 are formed in contact with the electrode layers 416, so that the interlayer insulating layer 425 is formed over the wiring layers 423 and the interlayer insulating layer 421. The wiring layers 423 can be formed in such a manner that a conductive film applicable to the electrode layers 416 is formed and processed by dry etching or the like. The interlayer insulating layer 425 can be formed in a manner similar to the interlayer insulating layer 421.

After that, the opening (not illustrated) reaching the gate electrode layer 413 is formed in the insulating layer 419, the interlayer insulating layer 421, and the interlayer insulating layer 425, and an electrode layer (or the gate wiring) (not illustrated) is formed in the opening; then, the wiring layer 427 is formed over the interlayer insulating layer 425 to be in contact with the electrode layer. These steps can be performed in a manner similar to the formation steps of the openings reaching the high-concentration impurity regions 409, the electrode layers 416, and the wiring layers 423.

Next, an insulating film to be processed into the interlayer insulating layer 429 is formed over the interlayer insulating layer 425 and the wiring layer 427. For the insulating film, the insulating film applicable to the interlayer insulating layer 421 can be used.

Then, the steps up to and including the formation step of the insulating layer 107 of the transistor 100 are performed, and an opening reaching the wiring layer 427 is formed in the interlayer insulating layer 429, the insulating layer 103, and the insulating layer 107. The electrode layer 431 is formed in the opening. The above embodiment can be referred to for the steps up to and including the formation step of the insulating layer 107 of the transistor 100. The steps before the formation of the electrode layer 431 can be performed in a manner similar to the formation steps of the openings reaching the high-concentration impurity regions 409, and the electrode layers 416.

Then, the steps subsequent to the formation of the insulating layer 107 of the transistor 100 are performed, so that the transistor 100 and the capacitor 150 are formed. For the steps, the above embodiment can be referred to.

The insulating layer 433 is then formed over the transistor 100 and the capacitor 150, and the insulating layer 435 is formed over the insulating layer 433. The insulating layer 433 and the insulating layer 435 can be formed using an insulating film and a formation method thereof that are applicable to the insulating layer 103 and the insulating layer 107 of the transistor 100. Note that since the insulating layer 433 and the insulating layer 435 function as protective insulating layers of the transistor 100, it is preferable to use an insulating film which can inhibit entry of hydrogen or a hydride such as water from the outside.

Then, the interlayer insulating layer 437 is formed over the insulating layer 435. The interlayer insulating layer 437 can be formed using an insulating film and a formation method thereof which are applicable to the interlayer insulating layer 421. The opening reaching the electrode layer 108c of the transistor 100 is formed in the insulating layer 433, the insulating layer 435, and the interlayer insulating layer 437, and in the opening, the electrode layer 439 is provided. These steps can be performed in a manner similar to the formation steps of the openings reaching the high-concentration impurity regions 409, and the electrode layers 416.

Lastly, the wiring layer 441 is formed over the interlayer insulating layer 437 to be in contact with the electrode layer 439. The wiring layer 441 can be formed by a step similar to that of the wiring layer 423.

Through the above-described steps, the semiconductor device 400 can be fabricated.

Since the oxide semiconductor layer is surrounded by (or embedded in) the insulating layer, the transistor 100 can be referred to as a transistor having a trench structure. The transistor 401 has a trench structure (shallow trench isolation: STI) in which the transistor is surrounded by the element isolation insulating layers 417. In other words, the semiconductor device 400, which includes the transistor 100 and the transistor 401, can be referred to as a semiconductor device having two kinds of trench structures (also called double trench structure).

It is also possible to fabricate a display device by combining a display element with the transistor 100 described in the above embodiment. For example, a pixel of a display device can be formed by combining a display element and the transistor 100 connected to the display element. A display element, a display device which is a device including a display element, a light-emitting element, and a light-emitting device which is a device including a light-emitting element, for example, can employ various modes and can include various elements. For example, a display medium, whose contrast, luminance, reflectivity, transmittance, or the like changes by electromagnetic action, such as an EL (electroluminescence) element (e.g., an EL element including organic and inorganic materials, an organic EL element, or an inorganic EL element), an LED (e.g., a white LED, a red LED, a green LED, or a blue LED), a transistor (a transistor which emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube, can be used as a display element, a display device, a light-emitting element, or a light-emitting device. Note that examples of display devices having EL elements include an EL display. Examples of display devices having electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices having electronic ink or electrophoretic elements include electronic paper.

[Structural Example 2 of Semiconductor Device]

A semiconductor device of one embodiment of the present invention at least includes the transistor 100 described in the above embodiment, and a transistor provided below the transistor 100 is not limited to the transistor 401. A semiconductor device of one embodiment of the present invention whose structure is partly different from that of the semiconductor device 400 is described below.

Figure 16A:
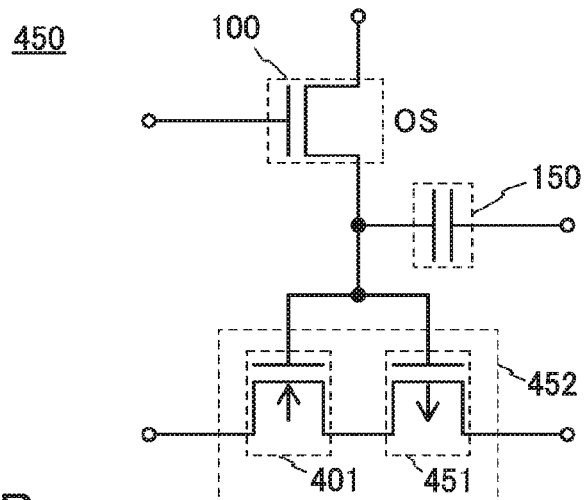
FIGS. 16A and 16B are a circuit diagram and a cross-sectional view illustrating a semiconductor device of one embodiment.
Figure 16B:
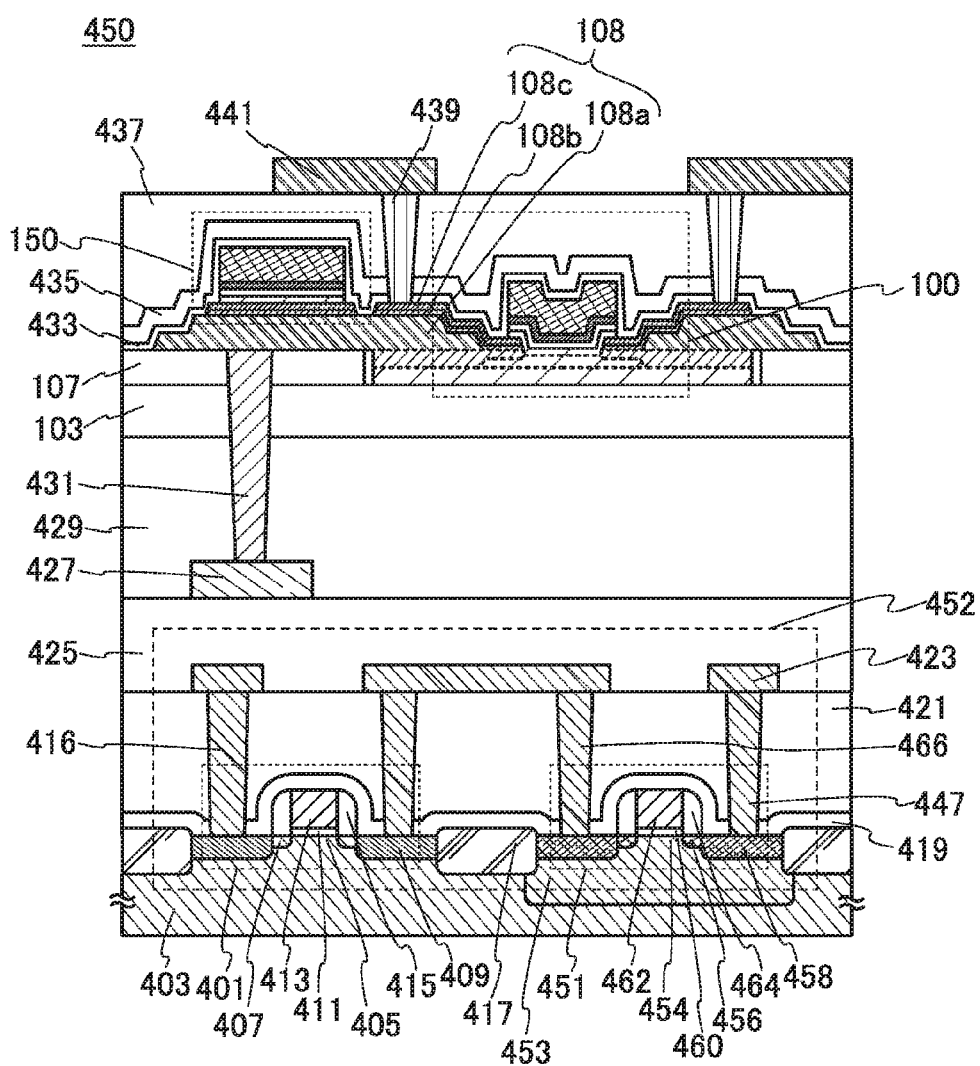

FIG. 16A is a circuit diagram illustrating a semiconductor device 450 whose structure is partly different from that of the semiconductor device 400, and FIG. 16B illustrates a cross-sectional structure of the semiconductor device 450.

The semiconductor device 450 is provided with a transistor 451 that is a p-channel transistor in addition to the transistor 401, and includes a complementary metal oxide semiconductor (CMOS) circuit 452 in which the transistor 401 and the transistor 451 are electrically connected. In the semiconductor device 450, the transistor 100 and the capacitor 150 are stacked over the CMOS circuit 452 with the interlayer insulating layers provided therebetween.

Since the transistor 100 is provided, electric charge can be held between the source or the drain of the transistor 100, one electrode of the capacitor 150, and the gates of the transistors 401 and 451 in the semiconductor device 450, as in the semiconductor device 400. In other words, the semiconductor device 450 can function as a semiconductor memory device.

In the semiconductor device 450, since the transistor 100 is included, power consumption is small as compared to the case where the semiconductor device illustrated in the circuit diagram in FIG. 16A is all formed using a semiconductor material other than an oxide semiconductor.

Since the semiconductor device 450 and the semiconductor device 400 are different from each other in mainly structures other than the structures of the transistor 100 and the capacitor 150, the CMOS circuit 452 is described here. Note that in description of the semiconductor device 450, the reference numerals used for the semiconductor device 400 are appropriately used.

In the CMOS circuit 452, the transistor 401 and the transistor 451 are electrically connected as described above.

For details of the transistor 401, the above description can be referred to.

The transistor 451 is provided on an n-well 453 which is formed by addition of an impurity element imparting n-type conductivity to the substrate 403. The transistor 451 includes a channel formation region 454 which is provided in the n-well 453; impurity regions 456 between which the channel formation region 454 is sandwiched; high-concentration impurity regions 458 which are electrically connected to the impurity regions 456 (the impurity regions 456 and the high-concentration impurity regions 458 are also referred to as impurity regions collectively); a gate insulating layer 460 which is provided over the channel formation region 454; a gate electrode layer 462 which is provided over the gate insulating layer 460; and sidewall insulating layers 464 which are provided on side surfaces of the gate electrode layer 462.

The insulating layer 419 is provided over the transistor 401 and the transistor 451, and the interlayer insulating layer 421 is provided over the insulating layer 419. An opening reaching the high-concentration impurity region 458 is provided in the insulating layer 419 and the interlayer insulating layer 421. In the opening, a source electrode layer or a drain electrode layer (hereinafter referred to as an electrode layer 447) of the transistor 451 is provided.

The wiring layer 423 is provided in contact with the electrode layer 447. The wiring layer 423 is provided in contact with the source electrode layer or the drain electrode layer to function as a source wiring or a drain wiring. The wiring layer 423 is electrically connected to other elements which are included in the semiconductor device 450, other devices, or the like.

In the case of the semiconductor device 450, the element isolation insulating layers 417 are provided on the substrate 403 so as to surround the transistor 401 and the transistor 451.

The impurity region 456 functions as an LDD region or an extension region. The high-concentration impurity region 458 functions as a source region or a drain region of the transistor 451.

In the semiconductor device 450, electrode layers 466 are provided in contact with the high-concentration impurity region 409 which is closer to the transistor 451 in the transistor 401 and the high-concentration impurity region 458 which is closer to the transistor 401 in the transistor 451. The electrode layers 466 function as the source electrode layer or the drain electrode layer of the transistor 401 and the source electrode layer or the drain electrode layer of the transistor 451. Further, the transistor 401 and the transistor 451 are electrically connected to each other with the electrode layers 466 to form the CMOS circuit 452.

The semiconductor device 450 can be fabricated by using the method for fabricating the semiconductor device 400 as appropriate. Here, a method for fabricating the CMOS circuit 452 is described.

An impurity element imparting n-type conductivity is added to a region of the substrate 403 in which the transistor 451 is to be formed, so that the n-well 453 is formed in the region. The channel formation region 454 of the transistor 451 is formed in the n-well 453. As the impurity element imparting n-type conductivity, phosphorus (P), arsenic (As), or the like can be used. The n-well 453 can be formed by addition of any of the above-described impurity elements by an ion doping method, an ion implantation method, or the like.

Then, the element isolation insulating layers 417 are formed, and the gate insulating layer 411, the gate electrode layer 413, the gate insulating layer 460, and the gate electrode layer 462 are formed. For these steps, the fabrication method of the semiconductor device 400 can be referred to.

Next, a protective layer is formed over a region where the transistor 401 and the element isolation insulating layers 417 are to be formed. An impurity element imparting p-type conductivity is added to the region where the transistor 451 is to be formed, using the protective layer and the gate electrode layer 462 as masks, so that impurity regions are formed. After the protective layer is removed, a protective layer is formed over a region where the transistor 451 and the element isolation insulating layers 417 are to be formed. An impurity element imparting n-type conductivity is added to the region where the transistor 401 is to be formed, using the protective layer and the gate electrode layer 413 as masks, so that impurity regions are formed. The concentration of the added impurity can be set as appropriate; the concentration is preferably raised in accordance with the degree of miniaturization of the semiconductor element. Alternatively, the impurity element may be added through an insulating film which is formed to cover the gate insulating layer 411, the gate electrode layer 413, the gate insulating layer 460, and the gate electrode layer 462.

Next, the sidewall insulating layers 415 and the sidewall insulating layers 464 are formed. For this step, the fabrication method of the semiconductor device 400 can be referred to.

Then, an insulating film to be processed into the insulating layer 419 is formed. A protective layer is formed over the transistor 401 and the element isolation insulating layers 417, and an impurity element imparting p-type conductivity is added to the impurity regions using the protective layer, the gate electrode layer 462, and the sidewall insulating layers 464 as masks, whereby the impurity regions 456 and the high-concentration impurity regions 458 are formed. After the protective layer is removed, a protective layer is formed over the transistor 451 and the element isolation insulating layers 417, and an impurity element imparting n-type conductivity is added to the impurity regions using the protective layer, the gate electrode layer 413, and the sidewall insulating layers 415 as masks, whereby the impurity regions 407 and the high-concentration impurity regions 409 are formed. Note that the impurity element may be added before the insulating film to be processed into the insulating layer 419 is formed, and then the insulating film may be formed. Note that the protective layer is removed after the impurity regions are formed.

Next, the insulating layer 419 and the interlayer insulating layer 421 are formed. The electrode layer 416 and the electrode layer 447 which are respectively in contact with the high-concentration impurity region 409 and the high-concentration impurity region 458 are formed. Then, the wiring layer 423 is formed. For these steps, the fabrication method of the semiconductor device 400 can be referred to.

After that, the interlayer insulating layer 425 is formed, and the wiring layer 427 is formed. The wiring layer 427 is electrically connected to the gate electrode layer 413 of the transistor 401 and the gate electrode layer 462 of the transistor 451 through openings provided in the interlayer insulating layer 425, the interlayer insulating layer 421, and the insulating layer 419.

The subsequent steps can be performed as in the case of the semiconductor device 400.

Through the above-described steps, the semiconductor device 450 can be fabricated. The semiconductor device 450, which includes the transistors 401 and 451 with trench structures in addition to the transistor 100, can be referred to as a semiconductor device having a double trench structure.

[Structural Example 3 of Semiconductor Device]

A semiconductor device of one embodiment of the present invention whose structure is partly different from that of the semiconductor device 400 or the semiconductor device 450 is described below.

Figure 17:
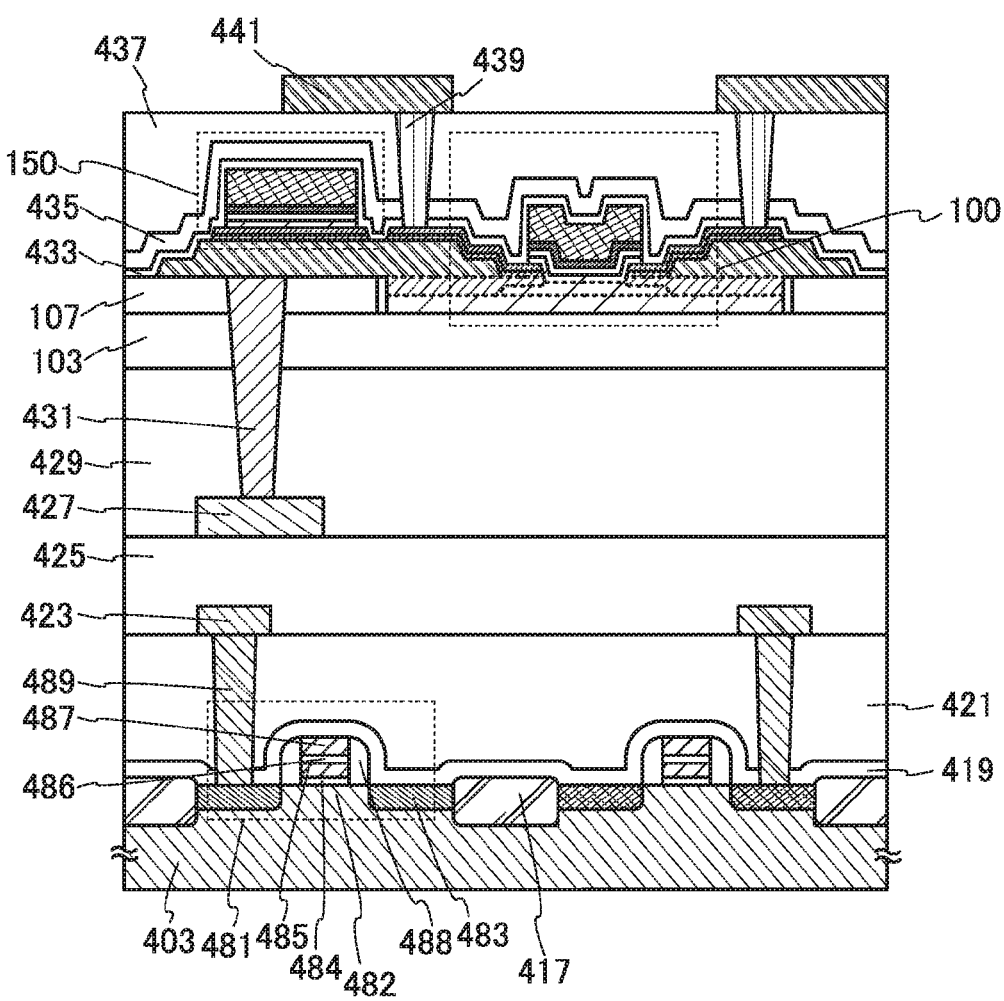
FIG. 17 is a cross-sectional view of a semiconductor device of one embodiment.

FIG. 17 is a circuit diagram illustrating a semiconductor device 480 whose structure is partly different from that of the semiconductor device 400 or the semiconductor device 450.

In the semiconductor device 480, the transistor 100 and the capacitor 150 are stacked over a transistor 481 with interlayer insulating layers provided therebetween.

Since the semiconductor device 480 includes the transistor 100 with a reduced off-state current, the power consumption can be reduced.

The element isolation insulating layers 417 are provided on the substrate 403 over which the transistor 481 is formed. Impurity regions 483, between which a channel formation region 482 is sandwiched, are provided between the element isolation insulating layers 417. A gate insulating layer 484 is provided over the channel formation region 482. A first gate electrode layer 485 is provided over the gate insulating layer 484. An insulating layer 486 is provided over the first gate electrode layer 485. A second gate electrode layer 487 is provided over the insulating layer 486. Sidewall insulating layers 488 are provided on side surfaces of the gate insulating layer 484, the first gate electrode layer 485, the insulating layer 486, and the second gate electrode layer 487.

The insulating layer 419 is provided over the transistor 481. The interlayer insulating layer 421 is provided over the insulating layer 419. Electrode layers 489 are provided in the insulating layer 419 and the interlayer insulating layer 421 to be in contact with the impurity regions 483. The wiring layers 423 are provided in contact with the electrode layers 489.

The interlayer insulating layer 425 is provided over the wiring layers 423. The wiring layer 427 is provided over the interlayer insulating layer 425. The wiring layer 427 is electrically connected to other elements of the semiconductor device 480, such as the transistor 481 (including the electrode layer 489 and the wiring layer 423), other devices, and the like.

The components provided over the wiring layer 427 are the same as those of the semiconductor device 400 and the semiconductor device 450.

In the transistor 481, the first gate electrode layer 485 functions as a floating gate; thus, the transistor 481 can function as a nonvolatile memory device. As illustrated in FIG. 17, a plurality of the transistors 481 can be provided over the substrate 403. When a plurality of the transistors 481 are provided, it is possible to increase the amount of data which can be stored. Note that in the case where a plurality of the transistors 481 are provided, the electrode layer 489 is not necessarily provided for each of the transistors.

The transistor 481 can be fabricated by appropriately using the method for fabricating the transistor 401 or the transistor 451 of the semiconductor device 400 and the semiconductor device 450. A method for fabricating a transistor which has a floating gate can also be applied to the fabrication of the transistor 481 as appropriate.

The semiconductor device 480, which includes the transistors 481 with trench structures in addition to the transistor 100, can be referred to as a semiconductor device having a double trench structure.

This embodiment can be combined with any of the other embodiments disclosed in this specification as appropriate.

Embodiment 4

Any of the semiconductor devices described in the above embodiments can be applied to a microcomputer used for a variety of electronic appliances.

A structure and operation of a fire alarm system that is an example of the electronic appliance using a microcomputer will be described with reference to FIG. 18, FIGS. 19A to 19C, and FIG. 20A.

The fire alarm in this specification refers to any system which raises an alarm over fire occurrence instantly and includes, for example, a residential fire alarm, an automatic fire alarm system, and a fire detector used for the automatic fire alarm system in its category.

Figure 18:
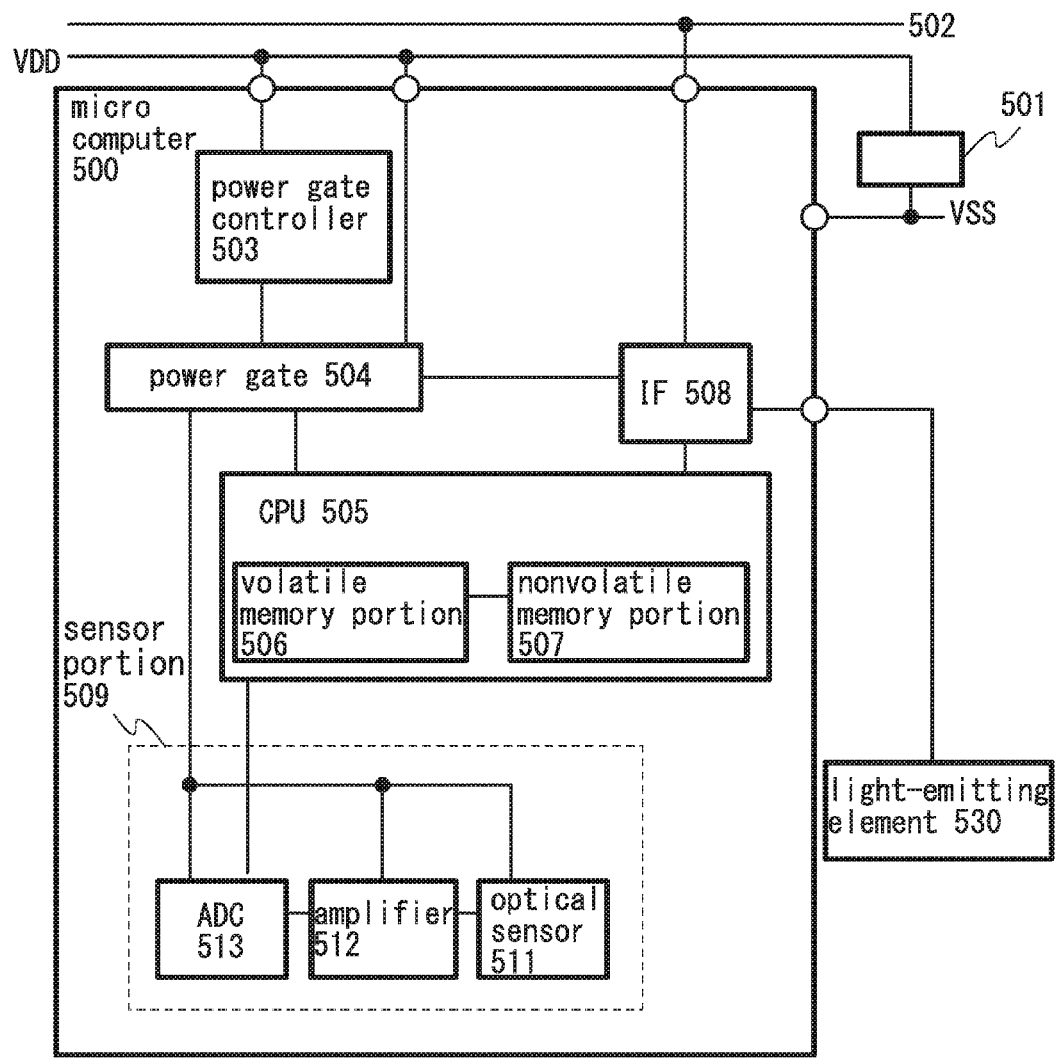
FIG. 18 is a block diagram illustrating an example of a semiconductor device of one embodiment.

An alarm system illustrated in FIG. 18 includes at least a microcomputer 500. The microcomputer 500 is provided inside the alarm system. The microcomputer 500 includes a power gate controller 503 electrically connected to a high potential power supply line VDD, a power gate 504 electrically connected to the high potential power supply line VDD and the power gate controller 503, a central processing unit (CPU) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 via an interface 508. The interface 508, as well as the CPU 505, is electrically connected to the power gate 504. As a bus standard of the interface 508, for example, an I²C bus can be used. A light-emitting element 530 electrically connected to the power gate 504 via the interface 508 is provided in the alarm system.

The light-emitting element 530 is preferably an element which emits light with high directivity, and for example, an organic EL element, an inorganic EL element, or an LED can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm system operates in such a manner, whereby power consumption can be reduced as compared to the case where power is continuously supplied to the above structures.

In the case where a transistor is used as the power gate 504, it is preferable to use a transistor which has an extremely low off-state current and can be used for the nonvolatile memory portion 507, for example, any of the transistors described in the above embodiments. With the use of such a transistor, a leakage current can be reduced when supply of power is stopped by the power gate 504, so that power consumption can be reduced.

A direct-current power source 501 may be provided in the alarm system so that power is supplied from the direct-current power source 501 to the high potential power supply line VDD. An electrode of the direct-current power source 501 on the high potential side is electrically connected to the high potential power supply line VDD, and an electrode of the direct-current power source 501 on the low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case which includes an electrode electrically connected to the high potential power supply line VDD, an electrode electrically connected to the low potential power supply line VSS, and a housing which can hold the battery is provided in the housing. Note that the alarm system does not necessarily include the direct-current power source 501 and may have, for example, a structure in which power is supplied from an alternate-current power source provided outside the alarm system through a wiring.

As the above battery, a secondary battery such as a lithium ion secondary battery (also called a lithium ion storage battery or a lithium ion battery) can be used. Further, a solar battery is preferably provided so that the secondary battery can be charged.

The sensor portion 509 measures a physical quantity relating to an abnormal situation and transmits a measured value to the CPU 505. A physical quantity relating to an abnormal situation depends on the usage of the alarm system, and in an alarm system functioning as a fire alarm, a physical quantity relating to a fire is measured. Thus, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The light-emitting element 530, the optical sensor 511, the amplifier 512, and the AD converter 513 operate when the power gate 504 allows supply of power to the sensor portion 509.

The optical sensor 511 includes at least a photoelectric conversion element such as a photodiode. The optical sensor 511 can be fabricated by utilizing the fabrication process of any of the semiconductor devices (e.g., the semiconductor device 400, the semiconductor device 450, and the semiconductor device 480) which are described in the above embodiments.

The photoelectric conversion element can be fabricated with the use of a semiconductor film which can perform photoelectric conversion, and for example, silicon, germanium, or the like can be used. In the case of using silicon for the semiconductor film, an optical sensor which senses visible light can be obtained. Further, there is a difference between silicon and germanium in wavelengths of absorbed electromagnetic waves. In the case of using germanium for the semiconductor film, a sensor which senses infrared rays can be obtained.

In the above manner, the sensor portion 509 including the optical sensor 511 can be incorporated into the microcomputer 500, so that the number of components can be reduced and the housing of the alarm system can be reduced.

In the fire alarm including the above-described IC chip, the CPU 505 in which a plurality of circuits each including any of the above transistors are combined and mounted on one IC chip is used.

Figure 19A:
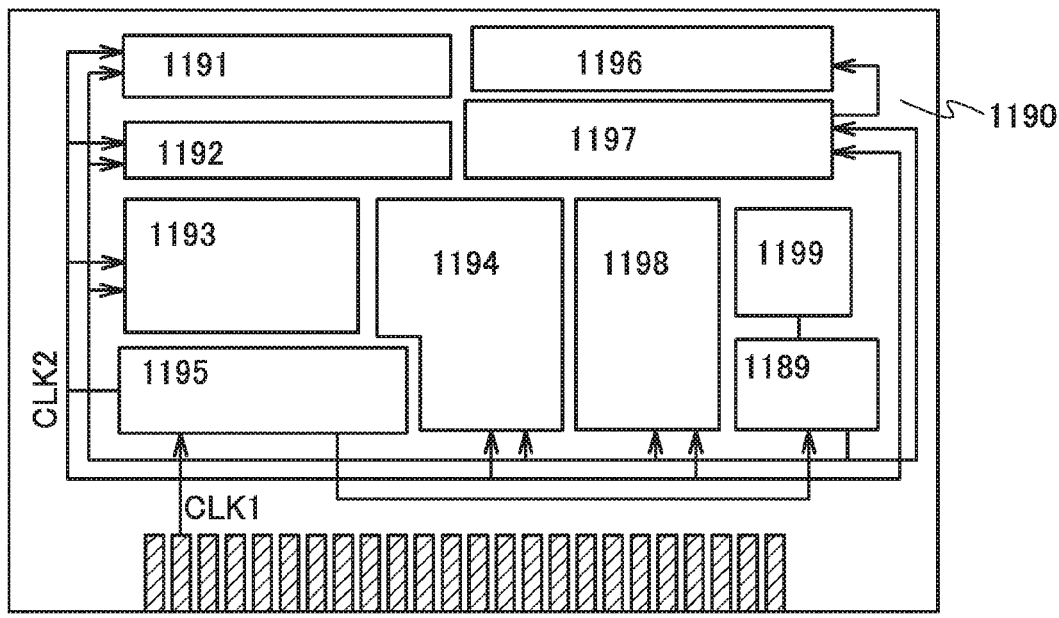
FIGS. 19A to 19C are block diagrams illustrating an example of a semiconductor device of one embodiment.
Figure 19B:
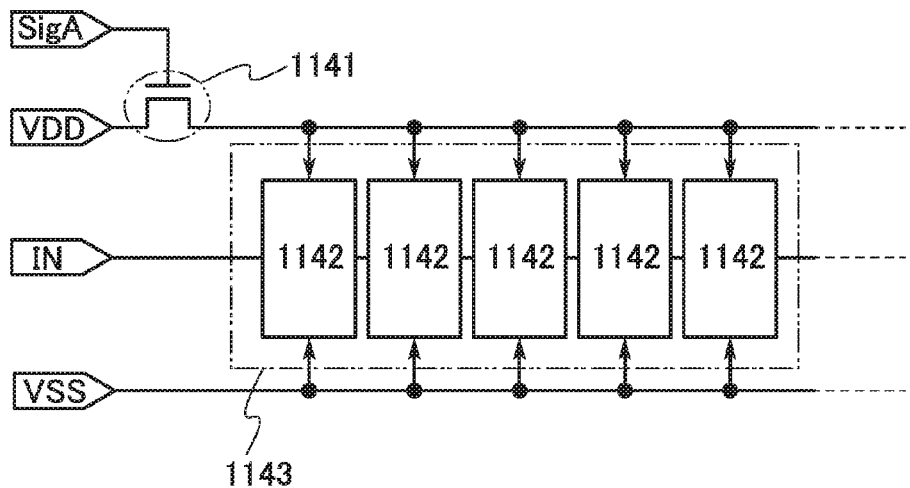
Figure 19C:
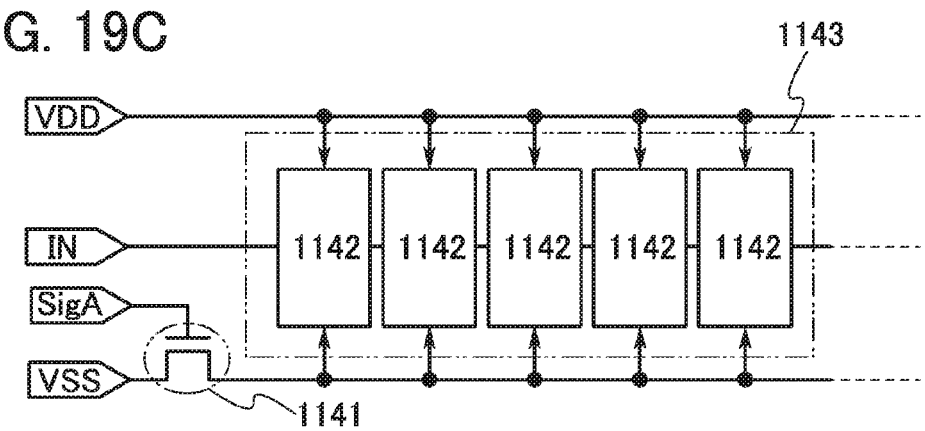

FIGS. 19A to 19C are block diagrams illustrating a specific structure of a CPU at least partly including any of the semiconductor devices described in the above embodiments.

The CPU illustrated in FIG. 19A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over separate chips. Needless to say, the CPU in FIG. 19A is just an example of a simplified structure, and an actual CPU may have a variety of structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 19A, a memory cell is provided in the register 1196. As the memory cell of the register 1196, the above transistor can be used.

In the CPU illustrated in FIG. 19A, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of a power supply voltage to the memory cell in the register 1196 can be stopped.

The power supply can be stopped by a switching element provided between a memory cell group and a node to which a power supply potential VDD or a power supply potential VSS is supplied, as illustrated in FIG. 19B or FIG. 19C. Circuits illustrated in FIGS. 19B and 19C are described below.

FIGS. 19B and 19C each illustrate a memory device in which any of the semiconductor devices described in the above embodiments is used as a switching element which controls supply of a power supply potential to a memory cell.

The memory device illustrated in FIG. 19B includes a switching element 1141 and a memory cell group 1143 including a plurality of memory cells 1142. Specifically, as each of the memory cells 1142, the above transistor can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 19B, the above transistor is used as the switching element 1141, and the switching of the transistor is controlled by a signal SigA supplied to a gate electrode layer thereof.

Note that FIG. 19B illustrates the structure in which the switching element 1141 includes only one transistor; however, one embodiment of the present invention is not limited thereto and the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 19B, the switching element 1141 may control the supply of the low-level power supply potential VSS.

FIG. 19C illustrates an example of a memory device in which each of the memory cells 1142 included in the memory cell group 1143 is supplied with the low-level power supply potential VSS via the switching element 1141. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

Figure 20A:
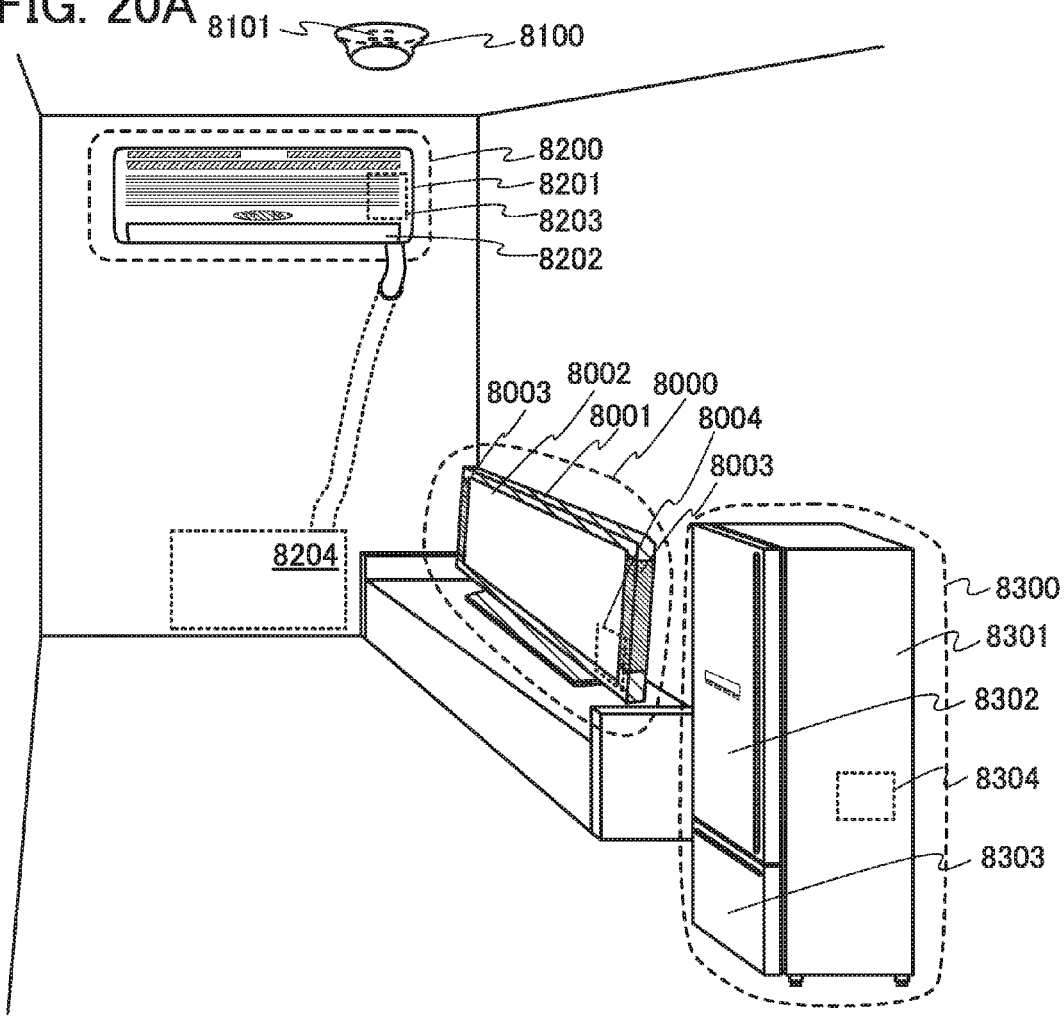
FIGS. 20A to 20C illustrate examples of a semiconductor device of one embodiment.

In FIG. 20A, an alarm system 8100 is a residential fire alarm, which includes a sensor portion and a microcomputer 8101. The microcomputer 8101 includes a CPU in which any of the above transistors is used.

In FIG. 20A, a CPU that uses any of the above transistors is included in an air conditioner which includes an indoor unit 8200 and an outdoor unit 8204. Specifically, the indoor unit 8200 includes a housing 8201, an air outlet 8202, a CPU 8203, and the like. Although the CPU 8203 is provided in the indoor unit 8200 in FIG. 20A, the CPU 8203 may be provided in the outdoor unit 8204. Alternatively, the CPU 8203 may be provided in both the indoor unit 8200 and the outdoor unit 8204. A CPU that uses any of the above transistors can save the power of the air conditioner.

In FIG. 20A, a CPU that uses any of the above transistors is included in an electric refrigerator-freezer 8300. Specifically, the electric refrigerator-freezer 8300 includes a housing 8301, a door for a refrigerator 8302, a door for a freezer 8303, a CPU 8304, and the like. In FIG. 20A, the CPU 8304 is provided in the housing 8301. A CPU that uses any of the above transistors can save the power of the electric refrigerator-freezer 8300.

Figure 20B:
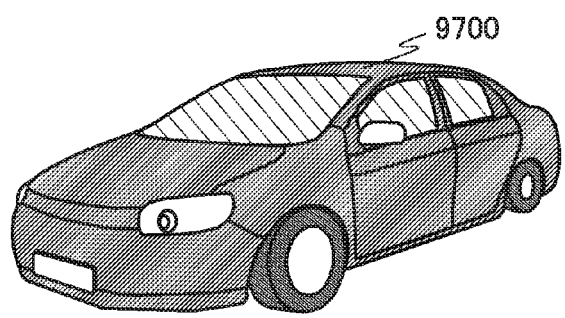
Figure 20C:
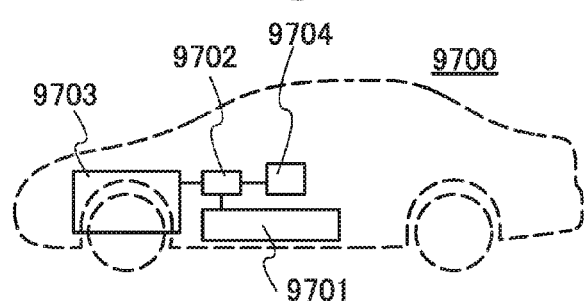

FIGS. 20B and 20C illustrate an example of an electric vehicle. The electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. A CPU that uses any of the above transistors can save the power of the electric vehicle 9700.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts a direct current into an alternate current is also incorporated.

This embodiment can be combined with any of the other embodiments disclosed in this specification as appropriate.

This application is based on Japanese Patent Application serial no. 2012-264583 filed with Japan Patent Office on Dec. 3, 2012, the entire contents of which are hereby incorporated by reference.

What is claimed is:

1. A semiconductor device comprising:
   a first oxide layer over an insulating surface;
   an oxide semiconductor layer over the first oxide layer;
   a second oxide layer over the oxide semiconductor layer;
   an insulating layer surrounding a side surface of the oxide semiconductor layer;
   a source electrode comprising a first source electrode and a second source electrode over the first source electrode;
   a drain electrode comprising a first drain electrode and a second drain electrode over the first drain electrode,
   a gate electrode overlapping with the oxide semiconductor layer; and
   a gate insulating layer between the oxide semiconductor layer and the gate electrode,
   wherein the source electrode and the drain electrode are electrically connected to the oxide semiconductor layer,
   wherein each of an end portion of the source electrode and an end portion of the drain electrode is interposed between the oxide semiconductor layer and the second oxide layer,
   wherein the first source electrode and the first drain electrode are in direct contact with the oxide semiconductor layer and the insulating layer,
   wherein the second source electrode and the second drain electrode are in direct contact with the oxide semiconductor layer,
   wherein a side surface of the second source electrode is in direct contact with the second oxide layer,
   wherein a side surface of the second drain electrode is in direct contact with the second oxide layer, and
   wherein the second oxide layer comprises indium or zinc.

2. The semiconductor device according to claim 1, further comprising an oxide layer between the oxide semiconductor layer and the insulating layer,
   wherein the oxide layer is in contact with the side surface of the oxide semiconductor layer.

3. The semiconductor device according to claim 2, wherein the oxide layer comprises one or more kinds of metal elements contained in the oxide semiconductor layer.

4. The semiconductor device according to claim 1, wherein the second oxide layer is in contact with a top surface of the oxide semiconductor layer, a top surface of the source electrode, and a top surface of the drain electrode.

5. The semiconductor device according to claim 1,
   wherein the oxide semiconductor layer comprises a first region in electrical contact with the source electrode,
   wherein the oxide semiconductor layer comprises a second region in electrical contact with the drain electrode,
   wherein the oxide semiconductor layer comprises a third region comprising a channel,
   wherein the third region is provided between the first region and the second region, and
   wherein a thickness of the third region is thinner than a thickness of each of the first region and the second region.

6. The semiconductor device according to claim 1, wherein a top surface of the insulating layer is planarized.

7. A semiconductor device comprising:
   a first oxide layer over an insulating surface;
   an oxide semiconductor layer over the first oxide layer;
   a second oxide layer over the oxide semiconductor layer;
   an insulating layer surrounding a side surface of the oxide semiconductor layer;
   an oxide layer between the oxide semiconductor layer and the insulating layer;
   a source electrode comprising a first source electrode and a second source electrode over the first source electrode;
   a drain electrode comprising a first drain electrode and a second drain electrode over the first drain electrode,
   a gate electrode overlapping with the oxide semiconductor layer; and
   a gate insulating layer between the oxide semiconductor layer and the gate electrode,
   wherein the source electrode and the drain electrode are electrically connected to the oxide semiconductor layer,
   wherein the oxide layer is in contact with the side surface of the oxide semiconductor layer,
   wherein each of an end portion of the source electrode and an end portion of the drain electrode is interposed between the oxide semiconductor layer and the second oxide layer,
   wherein the first source electrode and the first drain electrode are in direct contact with the oxide semiconductor layer and the insulating layer,
   wherein the second source electrode and the second drain electrode are in direct contact with the oxide semiconductor layer, and
   wherein a side surface of the second source electrode is in direct contact with the second oxide layer,
   wherein a side surface of the second drain electrode is in direct contact with the second oxide layer, and
   wherein the second oxide layer comprises indium or zinc.

8. The semiconductor device according to claim 7, wherein the oxide layer comprises one or more kinds of metal elements contained in the oxide semiconductor layer.

9. The semiconductor device according to claim 7, wherein the second oxide layer is in contact with a top surface of the oxide semiconductor layer, a top surface of the source electrode, and a top surface of the drain electrode.

10. The semiconductor device according to claim 7,
wherein the oxide semiconductor layer comprises a first region in electrical contact with the source electrode,
wherein the oxide semiconductor layer comprises a second region in electrical contact with the drain electrode,
wherein the oxide semiconductor layer comprises a third region comprising a channel,
wherein the third region is provided between the first region and the second region, and
wherein a thickness of the third region is thinner than a thickness of each of the first region and the second region.

11. The semiconductor device according to claim 7, wherein a top surface of the insulating layer is planarized.

* * * * *